US005492605A

United States Patent [19]
Pinarbasi

[11] Patent Number: 5,492,605
[45] Date of Patent: Feb. 20, 1996

[54] ION BEAM INDUCED SPUTTERED MULTILAYERED MAGNETIC STRUCTURES

[75] Inventor: Mustafa Pinarbasi, Morgan Hill, Calif.

[73] Assignee: International Business Machines Corporation, Armonk, N.Y.

[21] Appl. No.: 282,093

[22] Filed: Jul. 27, 1994

Related U.S. Application Data

[63] Continuation of Ser. No. 934,581, Aug. 24, 1992, abandoned.

[51] Int. Cl.[6] .................................................. C23C 14/34
[52] U.S. Cl. ........................ 204/192.11; 204/192.15; 204/192.23
[58] Field of Search .......................... 204/192.11, 192.2, 204/192.22, 298.04, 192.15

[56] References Cited

U.S. PATENT DOCUMENTS

| | | | |
|---|---|---|---|
| 4,663,685 | 5/1987 | Tsang et al. ............................. | 360/113 |
| 4,923,585 | 5/1990 | Krauss et al. ......................... | 204/298.04 |
| 5,014,147 | 5/1991 | Parkin et al. ........................... | 360/113 |
| 5,018,037 | 5/1991 | Krounbi et al. ........................ | 360/113 |
| 5,089,104 | 2/1992 | Kanda et al. .......................... | 204/192.11 |

FOREIGN PATENT DOCUMENTS

| | | | |
|---|---|---|---|
| 119005 | 5/1989 | Japan ................................. | 204/192.11 |
| 2018916 | 1/1990 | Japan ................................. | 204/192.11 |

OTHER PUBLICATIONS

Kane et al., "Characteristics . . . films", J. Vac. Sci. Technol., 16(2), Mar./Apr. 1979, pp. 171–174.
Gautherin et al., "Some Trend . . . Methods", Thin Solid Films, 50 (1978), pp. 135–144.

*Primary Examiner*—Nam Nguyen
*Attorney, Agent, or Firm*—Leslie G. Murray

[57] ABSTRACT

An ion beam sputter deposition system and method for the fabrication of multilayered thin film structures is described. Selected combinations of ion beam gases and energies matched to the selected target materials optimize the physical, magnetic and electrical properties of the deposited thin film layers. Matching the ion beam gas atomic mass to the target material atomic mass provides thin metal films having densities and resistivities very close to their bulk property values. Utilizing low ion beam energies in combination with high-mass ion beam gases results in the deposited thin films having low internal stress. The ratio of the ion beam gas mass to the target material mass is shown to be the determining factor for achieving the desired thin film properties in the described ion beam sputtering system. Both the mass of the ion beam sputtering gas and the energy of the ion beam is controlled as a function of the target material to provide single-layered and multilayered structures wherein selected properties of each layer are optimized to provide a specific function for each layer in the resulting structure.

36 Claims, 15 Drawing Sheets

```
MODE : PROGRAM
  CURRENT ACTIVITY STANDBY

MAIN MENU

1) System Status Display and Menu        Function Keys:
2) Beam Recipe Menu
3) Film Recipe Menu                      F1 - System Status Display
4) Master Recipe Menu                    F2 - Main Menu
5) Change Software Calibration Constants F3 - Vacuum Status
6) Change General Constants and Parameters  F5 - Fault Listing
7) Vacuum Status                         F10 - Return to Previous
8) Fault Listing                                 Screen
9) Transfer Recipe Files                 Thsese keys are usable
10) Transfer/Delete Data Files           on all displays Enter Selection # or 'F' key :
```

*FIG. 10A*

```
MODE : PROGRAM
  CURRENT ACTIVITY EDITING

MODIFY FILM RECIPE SCREEN

Recipe Name : Fe3000

Deposition recipe                       beam1
Use Ion Assist Parameters (Y/N) ?       Yes
Ion Assist Recipe                       beam2
Target Material                         Fe
Thickness Required (kÅ)                    3.00
Desired Rate of Deposition (Å/S)           5.00
Deposition - Warning Value (%)            25
Deposition - Shutdown Value (%)           50
Ambient Gas Flow (seem)                    5.00
Wobble (Y/N) ?                          No Enter new value (or press ret to save old value) :
Press ESC at any time to end the modification process Press Ins to see available beam recipes
```

*FIG. 10B*

```
MODE : PROGRAM
   CURRENT ACTIVITY EDITING

BEAM RECIPE MODIFICATION SCREEN

Recipe Name : beam1

Independent Variables    Tolerances
                      Setpoints         for WARNING      for SHUT-DOWN
Beam Voltage (V)       1000.00               2                 3
Beam Current (mA)       250.00               2                 3
Gun Gas (sccm)           12.00               2                 3

Type in new value, or press ret if the old value is correct
Press ESC key at any time to end the modification process
```

*FIG. 10C*

```
MODE : PROGRAM
   CURRENT ACTIVITY EDITING

BEAM RECIPE MODIFICATION SCREEN

Recipe Name : beam1

Trigger Values for Dependent Variables
                      for WARNING         for SHUT-DOWN
Discharge Current (A)      5.
Cathode Current (A)       12.                  15.
Accel. Current (mA)       50.                 100.
Newt Heat Current (A)     12.                  15.

Type in new value, or press ret if the old value is correct
```

*FIG. 10D*

```
MODE : PROGRAM
  CURRENT ACTIVITY EDITING

MODIFY MASTER RECIPE SCREEN PAGE 1

Recipe Name : fe_al_2

Do you wish to pre-clean the stage (Y/N)? . . .   Yes
Stage Pre-Clean Recipe      . . . . . . . .   beam1
Stage Pre-Clean Time (sec)  . . . . . . . .    180

Target Pre-Clean Recipe     . . . . . . .    beam2
Target Pre-Clean Time (sec) . . . . . . .      60

Press ESC key any thime to end the modification process
Type in new value, or press ret if the old value is correct
```

FIG. 10E

```
MODE : PROGRAM
  CURRENT ACTIVITY NULL ACTIVITY

MODIFY MASTER RECIPE SCREEN PAGE 2

Recipe Name : fe_al_2
                               Target Pre-clean (Yes/No)
Film Recipe #1      fe3000         Yes
Film Recipe #2      al1500         Yes
Film Recipe #3      fe3000         Yes
Film Recipe #4      al1500         Yes
Film Recipe #5
Film Recipe #6
Film Recipe #7
Film Recipe #8
Film Recipe #9
Film Recipe #10

Enter modified recipe name (press ret to write over the old recipe)
```

FIG. 10F

ION BEAM INDUCED SPUTTERED MULTILAYERED MAGNETIC STRUCTURES

This is a continuation of application Ser. No. 07/934,581 filed on Aug. 24, 1992, now abandoned.

BACKGROUND OF THE INVENTION

The present invention relates generally to the formation of thin film structures by ion beam sputter deposition and, more particularly, to the fabrication of thin film structures and magnetoresistive sensors wherein the ratio of the atomic mass of the ion beam sputter gas to the atomic mass of the target material is controlled to produce thin film structures having desired properties.

It is well-known in the prior art to utilize RF or DC magnetron sputter-deposition apparatus for fabrication of thin film devices such as magnetic recording sensors and storage media. Such sputter devices are characterized by crossed electric and magnetic fields in an evacuated chamber into which an inert, ionizable gas, such as argon, is introduced. The gas is ionized by electrons accelerated by the electric field, which forms a plasma in proximity to a target structure. The crossed electric and magnetic fields confine the electrons in a zone between the target and substrate structures. The gas ions strike the target structure, causing ejection of atoms that are incident on a workpiece, typically a substrate on which it is desired to deposit one or more layers of selected target materials.

In prior art conventional sputtering devices relatively high operating pressures are utilized in order to obtain films having low internal stress which results in non-directional sputtering flux at the substrate. However, this non-directional flux introduces manufacturing process difficulties as device dimensions become increasingly smaller. For example, in a metal liftoff process with bilayer photoresist, a 0.5 micrometer (um) undercut is required to prevent fencing. As line dimensions decrease below 5.0 um, an undercut of this magnitude not only introduces adhesion problems with the bilayer photoresist, but it becomes increasingly difficult to accurately define track width in high density storage media. Additionally, high-pressure sputtering can result in porous films having columnar zone 1 type microstructure. A porous microstructure degrades physical properties of the films, such as resistivity, and introduces long-term stability problems in the films.

It is known in the prior art to utilize secondary beam deposition, also referred to as ion beam sputter deposition, in certain applications to overcome some of the difficulties encountered with conventional RF/DC sputter techniques. Several aspects of ion beam sputter deposition differ from conventional sputter processes and provide significant advantages. The use of low background pressure results in less gas incorporation in the deposited films and less scattering of sputtered particles, i.e., longer mean-free path, during the transit from the target to the substrates. Control of the ion beam directionality provides both a variable angle of incidence of the beam at the target and a controllable angle of deposition at the substrates. A nearly monoenergetic beam having a narrow energy distribution provides control of the sputter yield and deposition process as a function of ion energy and enables accurate beam focusing and scanning. The ion beam is independent of target and substrate processes which allows changes in target and substrate materials and geometry while maintaining constant beam characteristics and allowing independent control of the beam energy and current density. Finally, since the target and substrate are not part of the RF/DC circuit, substrate heating is minimized reducing cooling requirements. However, a major hurdle encountered with ion beam sputter deposition is the resulting high internal stress in the deposited films. This is due primarily to high energy bombardment during deposition of the film by backscattered neutral atoms as a result of high ion beam energies and the relatively low operating pressure utilized in the ion beam deposition apparatus.

Apparatus and methods fop producing a thin film deposit on a substrate utilizing ion beam sputtering are described, for example, in U.S. Pat. No. 4,923,585, to Krauss et al. Krauss et al discloses the use of a computer controlled, single ion beam with a quartz crystal monitor to produce deposited films of arbitrary composition as well as layered structures of arbitrary thickness from multiple targets of elemental components of the desired films and layered structures. While Krauss et al discloses the use of a high energy ion beam to obtain films of desired composition, the problems associated with films having high internal stress or the effects of backscattered neutral beam atoms on film purity and characteristic properties are not addressed.

SUMMARY OF THE INVENTION

It is according a principal object of the present invention to provide all ion beam deposition method wherein the residual internal stress in deposited films and multilayered structures is minimized.

It is another object of the present invention to provide thin films wherein the resistivity of such films is minimized.

A still further object of the present invention is to provide thin film structures wherein desired characteristics of such films are optimized in such structures for particular applications.

It is yet another object of the present invention to provide multilayered thin film structures wherein the amount of absorbed ion beam neutral molecules is minimized.

It is yet another object of the present invention to provide multilayered thin film structures forming magnetoresistive read sensors fabricated by ion beam sputter deposition techniques.

These and other objects of the present invention are accomplished by an ion beam sputter deposition system in which the ratio of the mass of the ion beam gas to the mass of the sputtering target material is controlled to be near or greater than one. An ion beam sputter deposition system according to the principles of the present invention comprises a computer-controlled, single ion beam deposition system utilizing one or more selectable targets and a thickness monitor means to provide single-film and multi-film structures of desired thickness deposited on a substrate. Alternatively, both the mass of the ion beam gas and the energy of the ion beam can be controlled as a function of the target material to provide single-layer and multilayered structures wherein selected properties of each layer are optimized to provide a specific function for each layer in the resulting structures.

Backscattered neutral atoms from the target are one of the principal factors in determining the properties of ion beam sputtered films. High levels of absorbed gases as well as physical damage and composition changes in the deposited thin film layers result from bombardment by backscattered neutral atoms during deposition of the film. The ratio of the sputtering gas mass to the target mass is the parameter which has the greatest influence on the number and energy of backscattered neutral atoms and thus, as a result controls the properties of the deposited films. Ion beam energy is also a critical factor on the number and energy of backscattered neutral atoms when heavy mass target materials are sputtered using low mass noble gases. In contrast, however, the ion beam energy affects the film properties to a lesser degree if the mass of the sputtering gas exceeds the mass of the target material.

The ion beam sputtering method of the present invention provides fundamental advantages over prior DC/RF sputtering and ion beam sputtering techniques. Ion beam deposition allows greater isolation of the substrate from the ion generation process than is encountered in the prior art DC/RF diode sputtering systems. This enables control over the substrate temperature, gas pressure, angle of deposition and the type of particle bombardment of the growing film, as well as independent control over the ion beam current and energy. Additional, the low pressures utilized in ion beam systems provide a nearly/directional deposition flux at the substrate. Maximizing the ratio of the sputtering gas mass to the target material mass and utilizing relatively/low ion beam energies, absorption of backscattered neutral atoms and radiation damage in the deposited film are greatly reduced resulting greatly reduced internal stress and resistivity and greater density in the films.

BRIEF DESCRIPTION OF THE DRAWINGS

The foregoing and other objects, features and advantages of the present invention will be apparent from the following detailed description of the preferred embodiments of the invention, reference being made to the accompanying drawings, in which like reference numerals indicate like parts and in which

FIGS. 5a–5d are graphs plotting internal stress versus ion beam voltage for selected metallic films deposited in various ion gases;

FIGS. 10a–10f are diagrams illustrating the main menu and various CRT display screens utilized to create and edit recipes for ion beam deposition of thin film structures utilizing the ion beam deposition system shown in FIG. 6.

DETAILED DESCRIPTION OF THE PREFERRED EMBODIMENT

Figure 1:
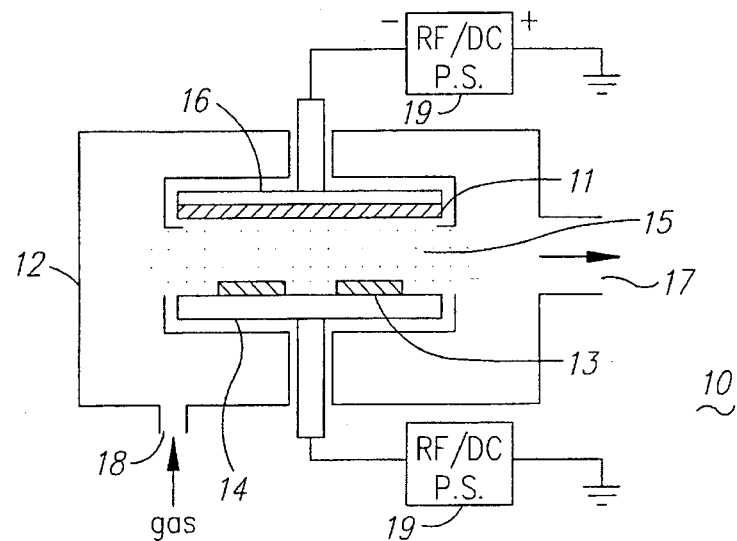
FIG. 1 is a block diagram from the side illustrating a prior art DC/RF sputter deposition system.

Referring now to FIG. 1, a diagram illustrating a generalized prior art DC/RF sputtering system 10 is shown. Briefly, the DC/RF sputtering system 10 comprises a vacuum chamber 12 containing and mounting within a cathode assembly 16 and an anode assembly 14, a high voltage DC/RF power supply 19 being coupled thereto and providing an electric field therebetween. The chamber 12 is evacuated to a selected operating pressure through port 17 by a vacuum pump (not shown). One or more workpieces or substrates 15 are mounted on a surface of the anode assembly 14 while one or more targets 11 comprising the materials to be deposited on the substrates are mounted on an opposing surface of the cathode assembly 16 across a work volume 15 opposite the substrates 13. An inert, ionizable gas, such as argon, is introduced to the chamber 12 via port 18. The gas is ionized by electrons accelerated by the electric field, which forms a plasma in the work volume 15 in proximity to the target structure 11. In a magnetron sputter system crossed electric and magnetic fields confine the electrons in a zone between the cathode assembly 16 and the anode assembly 14. The gas ions strike the target 11, causing emission of atoms from the target material that are incident on the substrates 13.

In DC/RF sputtering systems the surfaces of the targets 11, substrates 13, vacuum chamber 12 and other system components internal to the vacuum chamber are critical to the sputtering process and greatly affect the properties of deposited films. For example, in such a system 10, shapers in direct contact with the plasma are used to confine the plasma to certain areas to increase the thickness uniformity of the deposited films. With time, these shapers become coated and will affect the plasma and may cause uncontrollable changes in the film properties or contaminate the substrate wafers such as by flaking or with particulates. Additionally, if a magnetic field is applied at the substrate it interferes with the plasma altering the plasma and may also affect the properties of the deposited films in an uncontrollable manner.

Figure 2:
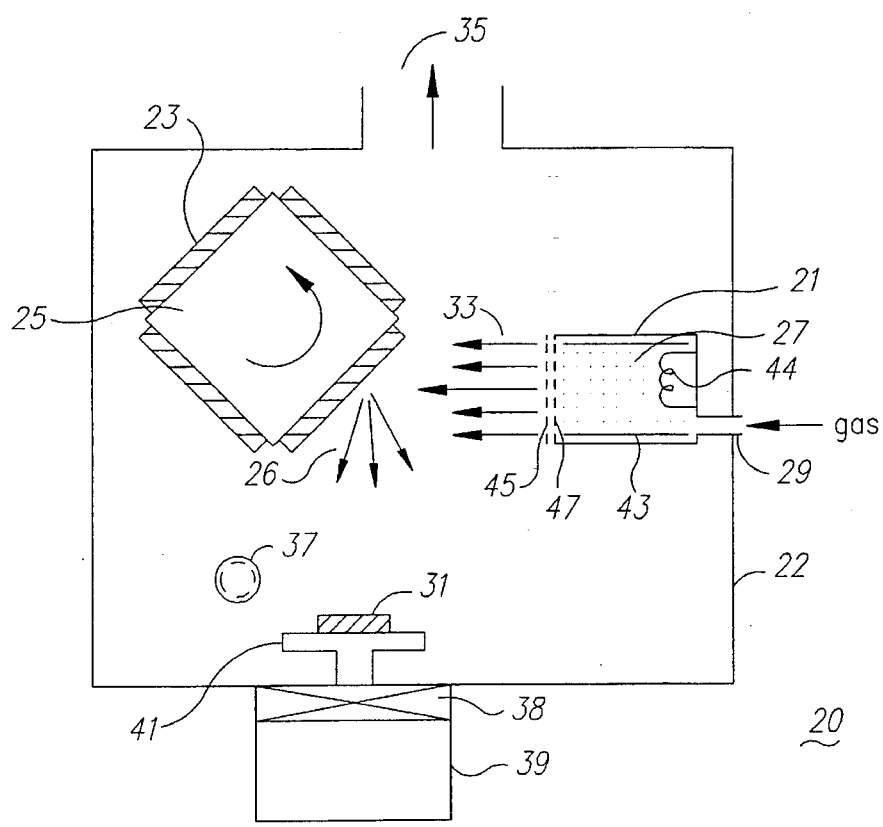
FIG. 2 is a block diagram providing a top view of an ion beam deposition system according to the principles of the present invention.

Referring now also to FIG. 2, a simplified block diagram illustrating an ion beam sputter deposition system constructed in accordance with the principles of the present invention is shown. The ion beam sputter deposition system 20 includes a vacuum chamber 22 in which an ion beam source 21 is mounted, a target 23 and a workpiece or deposition substrate 51. An ion beam 33 provided by the ion source 21 is directed at the target 23 where the impacting ions cause sputtering of the target material, Selectable, multiple targets 23 may be provided on a rotary target support 25. The sputtered atoms 26 emitted by the target material are directed onto a deposition substrate 31 on which is formed a layer of the target material. A thickness monitor positioned closely adjacent the substrate to provide realtime, in-situ monitoring of the thickness of the growing film during deposition. The substrate or other workpiece 51 is mounted on a movable pedestal or support member 41 which is retrieved into a loading port 39 via a gate valve; 38 for changing the workpiece 51. The pedestal 41 may also be temperature controlled, i.e., heated or cooled or both. A magnetic field may also be applied at the workpiece 31 if required for the particular structure being deposited. The pedestal 41 may also be rotated by means of a linear/rotary motor drive (not shown). During operation, the vacuum chamber is maintained at an internal operation pressure on the order of $1\times10^{-4}$ Torr by a vacuum pump (not shown) via port 35.

The ion beam source 27 may be any suitable ion beam source, a Kaufman source, for example. A typical arrangement for a Kaufman source includes a housing 21 which supports a cylindrical anode 43 having a thermionic cathode 44 positioned at the end of the anode 43 away from the target 23 and a screen grid 47, at cathode potential, at the end facing the target 23. A selected sputtering gas is introduced into the volume formed by the anode 43 via port 29. Electrons emitted by the cathode 44 ionize the gas to form a plasma which is confined by the screen grid 47 and, in some applications, an externally applied magnetic field (not shown). A magnetic field may also be used to prevent the electrons from traveling directly to the anode thereby increasing ionization efficiency and to increase beam uniformity. Aligned with and positioned closely adjacent to the screen grid 47, between the screen grid and the target 23, is an extraction or acceleration grid 45. The cathode current is independently controllable providing control of the beam current independently of the discharge voltage and beam energy.

The beam energy, i.e., the average energy possessed by an individual ion when it impacts the target 23, is primarily a function of the difference in potential between the target 23 and the source of the ions, essentially the anode 43 potential. To a lesser extent, the beam energy is also impacted by the degree of ionization of the gas which is a function of the discharge voltage, the voltage between the cathode and the anode. For example, in the case of argon (Ar) gas, the first ionization level is at 15.8 electron volts (ev) while the second ionization level is approximately 43.0 ev. Therefore, in the case of Ar, if the discharge voltage is maintained at less than approximately 43 volts, in the range of 38 to 40 volts, for example, secondary ionization will be minimized insuring a relatively monoenergetic beam. Controlling the discharge voltage also minimizes ion beam contamination due to anode sputtering.

According to the principles of the present invention, the ratio of the mass of the sputtering gas to the mass of the target material is controlled to be near or greater than one to minimize both the energy and number of backscattered neutral atoms of the sputtering gas from the target Given a particular sputtering gas, the number of backscattered neutral atoms is proportional to ion beam energy. Therefore, controlling the ion beam energy will control the number of backscattered neutral atoms. Of more importance, however, is that if heavy mass target materials, tungsten (W) or tantalum (Ta), for example, are sputtered with low mass gases, such as At, large numbers of the Ar atoms are reflected from the target toward the substrate while retaining a significant port/on of their initial energy. Since ion beam sputtering systems use a relatively low operating pressure, the mean free path for both the sputtered target ions and the backscattered neutral atoms generally is greater than the distance between the target and the substrate; typically the mean free path is on the order of 25 to 30 cm. This means that the probability of a collision is low and that backscattered atoms impacting the substrate can have sufficient energy to affect the properties of the growing films by inducing damage and implantation. Simply binary collision calculations show that an Ar ion retains approximately 40 percent of its initial energy after colliding with a W target atom. However, the same calculations show that a krypton (Kr) ion retains approximately 14 percent of its initial energy while a xenon (Xe) ion retains only 2.6 percent of its initial energy after colliding with a W target atom. Thus, the ion beam energy constitutes a critical parameter if heavy mass target materials are sputtered using low mass noble gases, while the ion beam energy affects the growing film properties to a much lesser degree if the mass of the sputtering the gas is near or exceeds that of the target material.

Referring now also to FIGS. 3a and 3b, 4a–4d and 5a–5d, the; effects on the properties of ion beam sputtered thin films and multilayer thin film structures for selected target materials utilizing Ar, Kr and Xe as the sputtering gas have been systematically studied. The study covered the sputtering gas atom to target material atom mass ratio over a range from a ratio of 0.217 (At/W) to a ratio of 2.357 (Xe/Ni). The results are summarized in Table I below and the Figures.

TABLE I

ION BEAM SPUTTERED THIN FILMS

| Run # | Mat'l | Ion Beam Voltage (v) | Sputter gas | Stress (dyn/cm2) | Resistivity (uohm-cm) |
|---|---|---|---|---|---|
| 1116 | W | 400 | Ar | $-3.17 \times 10 + 10$ | 25.5 |
| 1162 | W | 500 | Ar | $-3.3 \times 10 + 10$ | 29.7 |
| 1110 | W | 750 | Ar | $-3.6 \times 10 + 10$ | 62 |
| 1109 | W | 1000 | Ar | $-3.74 \times 10 + 10$ | 80 |
| 1130 | W | 1250 | Ar | $-3.23 \times 10 + 10$ | 76 |
| 1131 | W | 1250 | Ar | $-3.44 \times 10 + 10$ | 84 |
| 1183 | W | 400 | Kr | $-1.5 \times 10 + 10$ | 12.5 |
| 1179 | W | 750 | Kr | $-2.5 \times 10 + 10$ | 14.2 |
| 1185 | W | 1250 | Kr | $-3.2 \times 10 + 10$ | 23.6 |
| 1139 | W | 400 | Xe | $-1.64 \times 10 + 10$ | 13.7 |
| 1145 | W | 750 | Xe | $-2.0 \times 10 + 10$ | 8.3–9.1 |
| 1137 | W | 1250 | Xe | $-1.44 \times 10 + 10$ | 14.3 |
| 1118 | Ta/W | 400 | Ar | $-1.35 \times 10 + 10$ | 28.8 |
| 1124 | Ta/W | 750 | Ar | $-1.42 \times 10 + 10$ | 36 |
| 1154 | Ta/W | 1000 | Ar | $-1.67 \times 10 + 10$ | 42 |
| 1153 | Ta/W | 1250 | Ar | $-1.87 \times 10 + 10$ | 43 |
| 1188 | Ta/W | 400 | Kr | $-1.15 \times 10 + 10$ | 17.8 |
| 1181 | Ta/W | 750 | Kr | $-1.16 \times 10 + 10$ | 16.8 |
| 1191 | Ta/W | 1250 | Kr | $-1.36 \times 10 + 10$ | 20.6 |
| 1146 | Ta/W | 400 | Xe | $-1.12 \times 10 + 10$ | 16.4 |
| 1144 | Ta/W | 750 | Xe | $-7.84 \times 10 + 9$ | 13.8–14.9 |
| 1143 | Ta/W | 1250 | Xe | $-7.3 \times 10 + 9$ | 16.8 |
| 1135 | Ru/W | 400 | Ar | $-3.97 \times 10 + 10$ | 12.1 |
| 1189 | Ru/W | 750 | Kr | $-4.84 \times 10 + 10$ | 10.2 |
| 1142 | Ru/W | 750 | Xe | $-4.1 \times 10 + 10$ | 9.1 |
| 1127 | Nb | 400 | Ar | $-1.2 \times 10 + 10$ | 20.3–22.5 |
| 1128 | Nb | 750 | Ar | $-1.4 \times 10 + 10$ | 23 |
| 1129 | Nb | 1250 | Ar | $-1.35 \times 10 + 10$ | 28.5 |
| 1187 | Nb | 400 | Kr | $-1.36 \times 10 + 10$ | 19.5 |
| 1182 | Nb | 750 | Kr | $-1.02 \times 10 + 10$ | 18.1 |
| 1186 | Nb | 1250 | Kr | $-1.48 \times 10 + 10$ | 18.6 |
| 1151 | Nb | 400 | Xe | $-1.33 \times 10 + 10$ | 18.9 |
| 1148 | Nb | 750 | Xe | $-9.9 \times 10 + 9$ | 16.8 |
| 1150 | Nb | 1250 | Xe | $-9.76 \times 10 + 9$ | 16.8 |
| 1224 | Ni | 400 | Ar | $-2.26 \times 10 + 9$ | 10.2 |
| 1226 | Ni | 750 | Ar | $-5.7 \times 10 + 9$ | 11 |
| 1227 | Ni | 1250 | Ar | $-8.9 \times 10 + 9$ | 14.2 |
| 1222 | Ni | 400 | Kr | $-2.2 \times 10 + 9$ | 10.5 |
| 1220 | Ni | 750 | Kr | $-2.7 \times 10 + 9$ | 10.4 |
| 1221 | Ni | 1250 | Kr | $-5.3 \times 10 + 9$ | 12 |
| 1215 | Ni | 400 | Xe | $-1 \times 10 + 9$ | 11.4 |
| 1214 | Ni | 750 | Xe | $-2.2 \times 10 + 9$ | 10.4 |
| 1213 | Ni | 1250 | Xe | $-3.7 \times 10 + 9$ | 11.8 |

The data provided in the Figures and in Table I indicate that as ion beam energy increases, the properties of deposited films such as resistivity, density and sputtered gas concentration degrade. This degradation of the film properties is caused primarily by implantation or absorption of and bombardment by the backscattered sputtering gas neutral atoms.

Figure 3A:
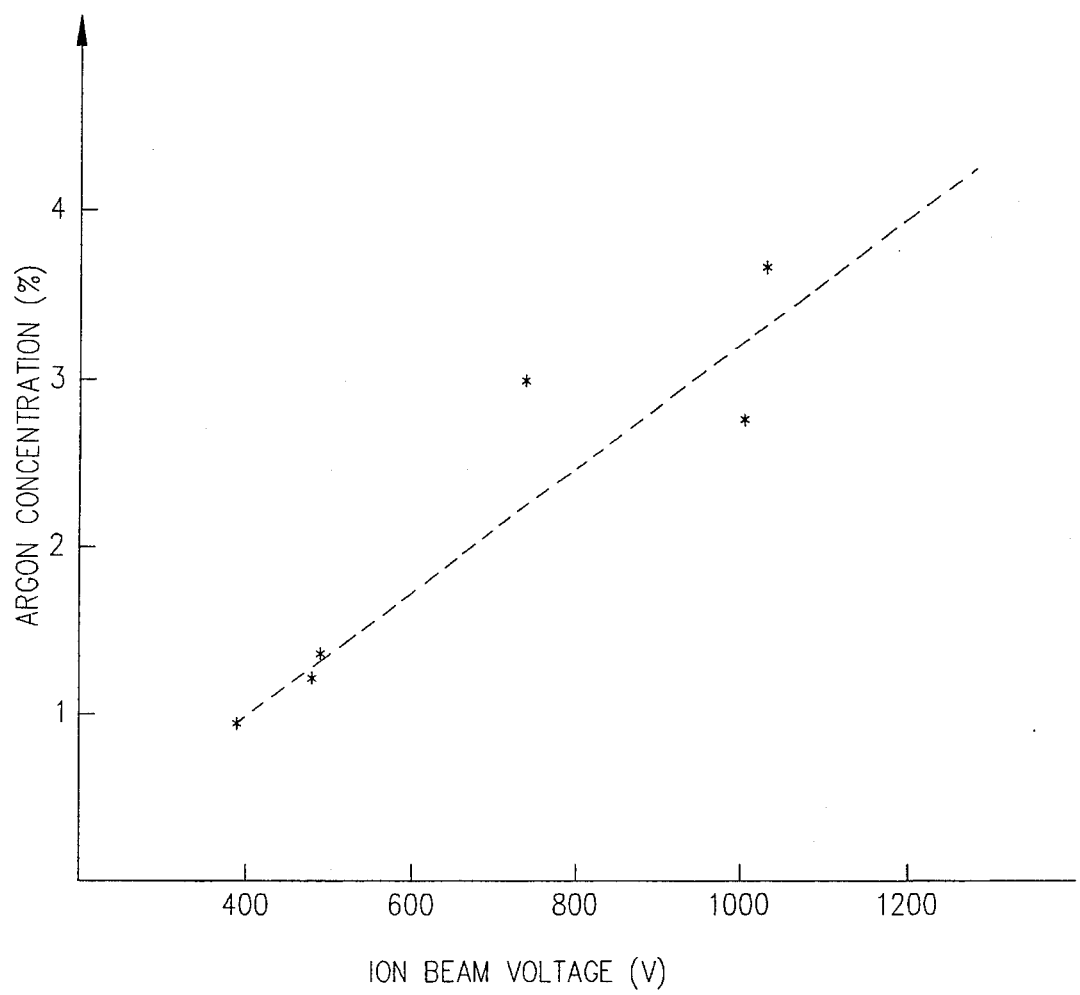
Figure 3B:
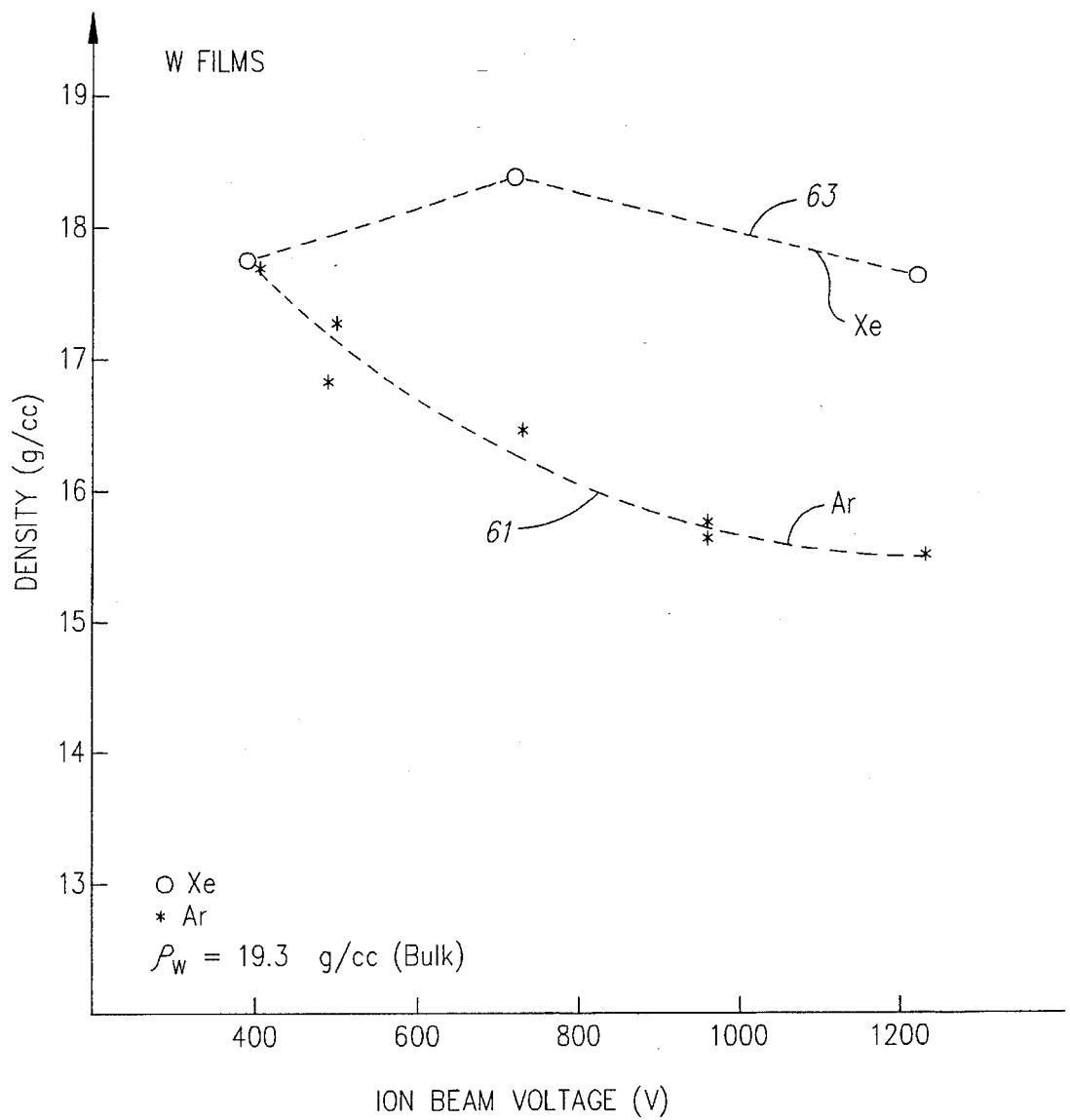

Rutherford Back Scattering (RBS) analysis of ion beam sputtered films shows that an increase in resistivity is coupled with an increase in the concentration of the implanted sputtering gas atoms and a decrease in the density of these films as the primary ion beam energy is increased. As shown in FIGS. 3a and 3b, in a W film, the Ar concentration increases from less than 1 percent to greater than 4 percent as the ion beam voltage increases from 400 volts to 1250 volts while the density of the Ar sputtered film, curve 61, decreased approximately 14 percent over the same increase in the ion beam voltage. Calculations show that the decrease is primarily due to the presence of Ar gas in the deposited films, although bombardment induced defects in the films can also contribute to the decrease in density. Xe sputtered W films, however, have a higher density (close to its bulk density of 19.3 gms/cc) which is much less dependent on ion beam voltage, curve 63. No presence of Xe gas was detected in any of the W films deposited using Xe as the sputtering gas.

Figure 4A:
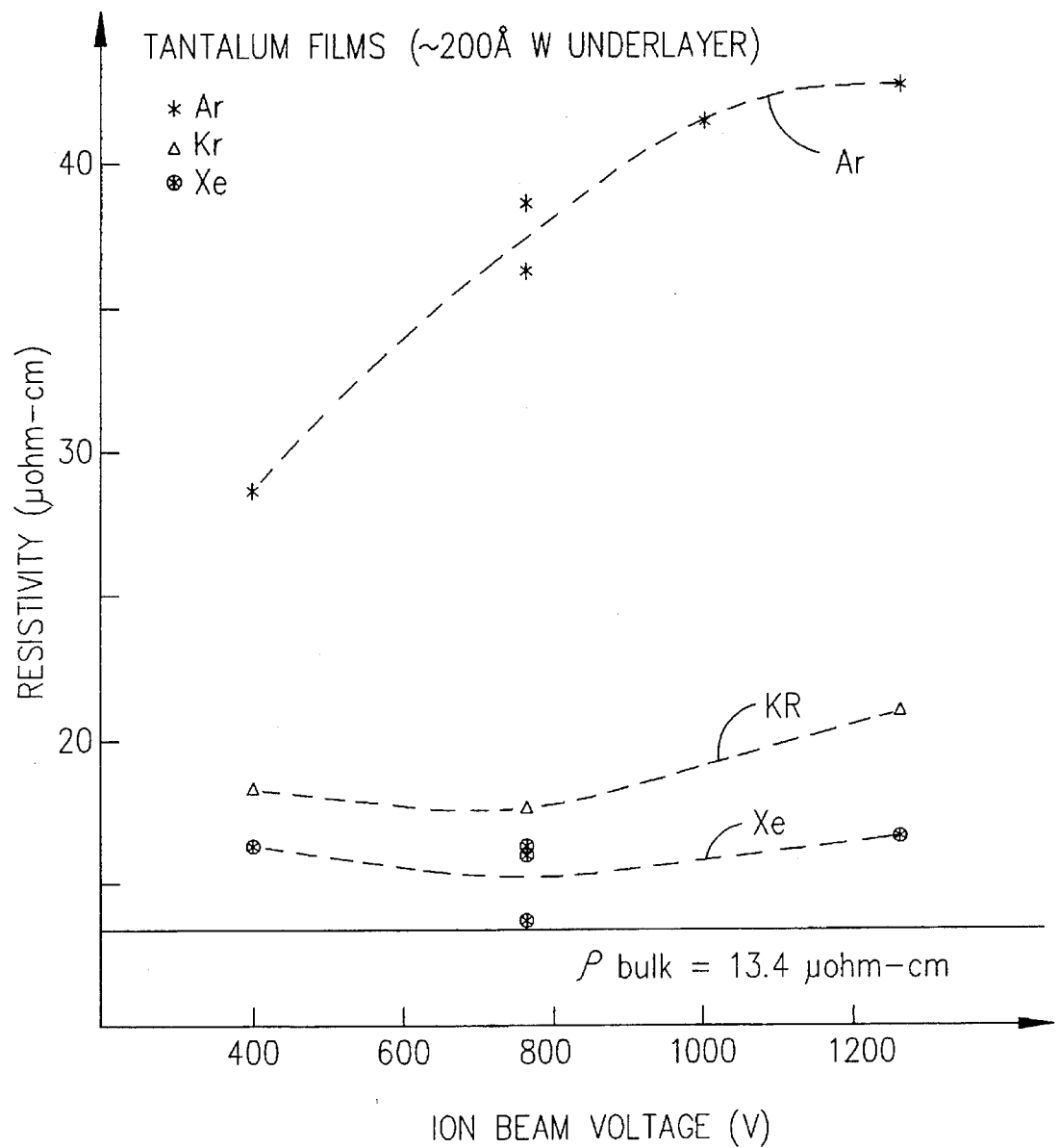
FIGS. 4a–4d are graphs plotting film resistivity versus ion beam voltage for selected metallic films deposited in various ion gases.
Figure 4B:
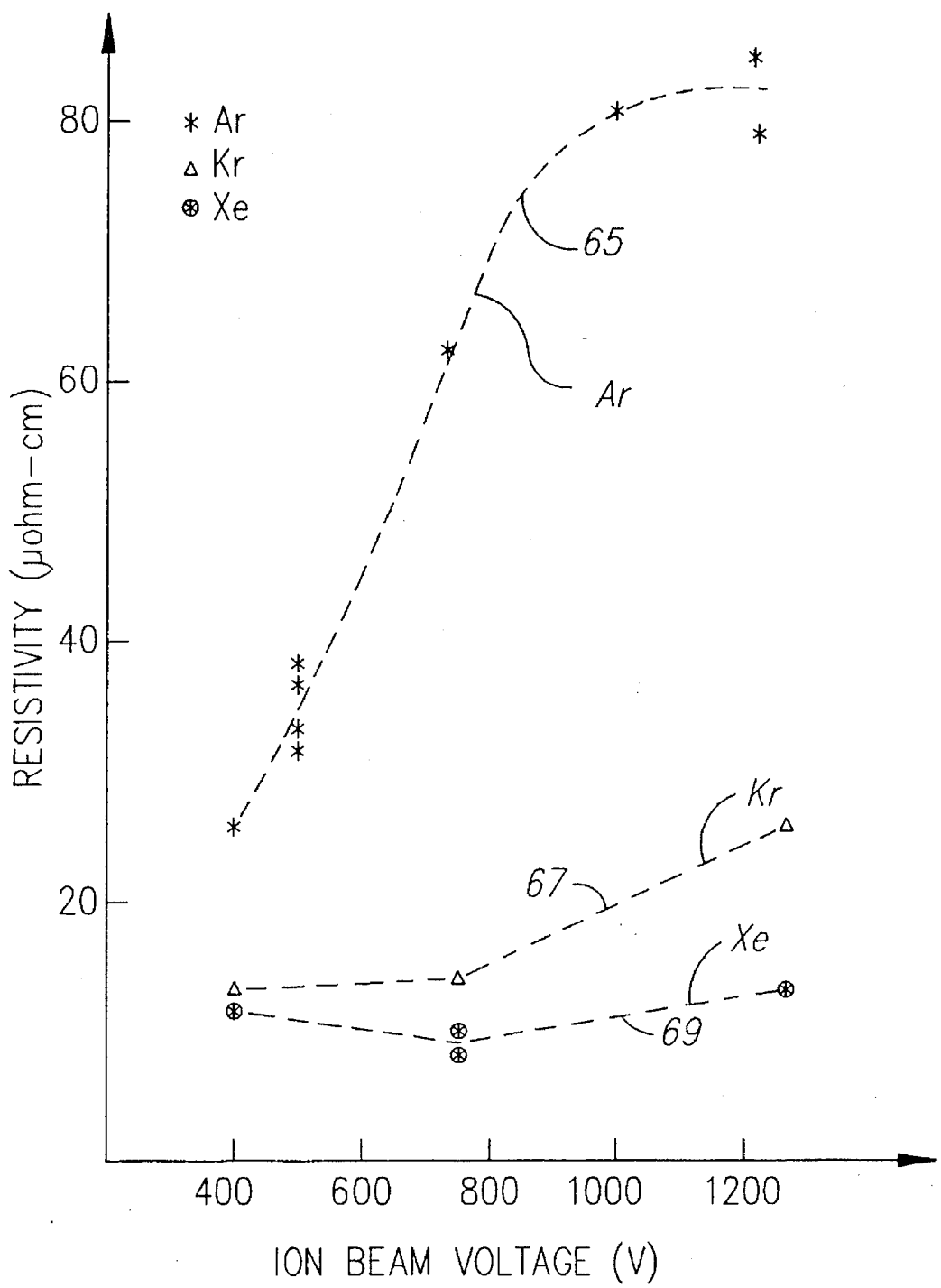
Figure 4C:
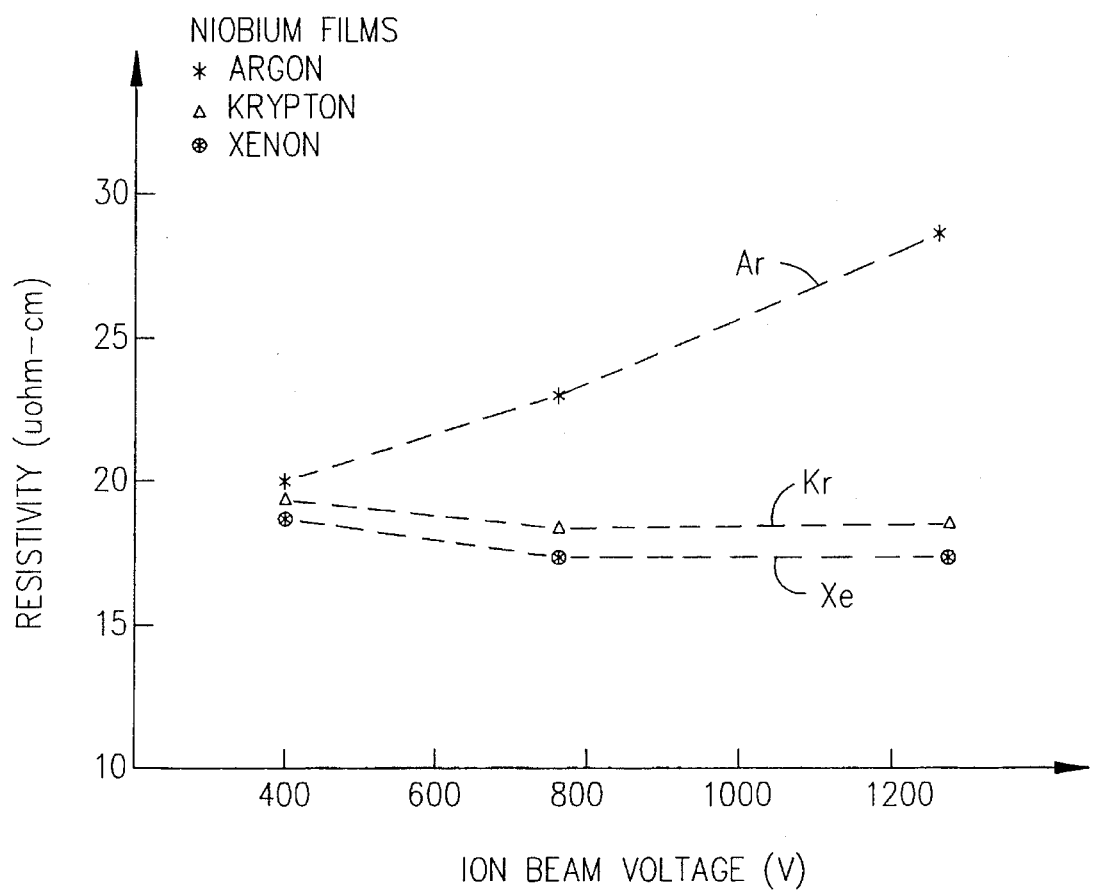
Figure 4D:
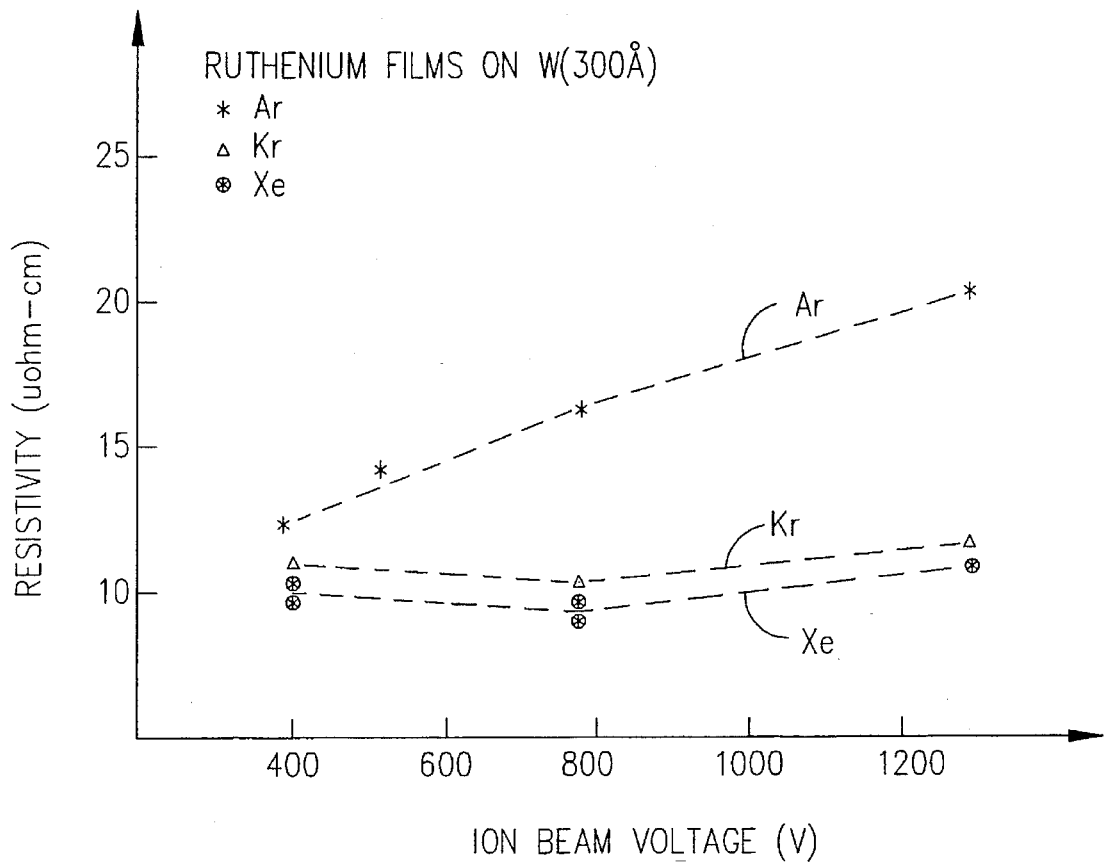

FIG. 4b shows a corresponding increase in resistivity, curve 65, for the Ar sputtered W film over the same ion beam voltage range. The resistivity of the W films increases from approximately 25.5 uohm-cm for 400 ev Ar ions to 84 uohm-cm for 1250 ev Ar ions. The increase in resistivity up to 1000 ev ion beam voltage is approximately linear but levels off at higher voltages as greater numbers of Ar ions are implanted at the target which compete with the backscattering. The resistivity of ion beam deposited W films using Kr (84 amu), curve 67, as the sputtering gas is much less dependent on the ion beam voltage while the resistivity of W films deposited using Xe (131 amu) as the sputtering gas is nearly independent of ion beam voltage. The W films deposited using 750 ev Xe ions had the lowest resistivity (8.3 uohm-cm) which corresponded to the greatest density N film obtained, curve 63. As shown in FIGS. 4a, 4c and 4d, similar results were obtained For ion beam sputtered Ta films, Niobiun (Nb) films and Ruthenium (Ru) films, respectively. In all cases studied, ion beam sputtered films using Xe as the sputtering gas have resistivities as much as a factor of 6 less than that of films deposited using Ar as the sputtering gas.

Figure 5A:
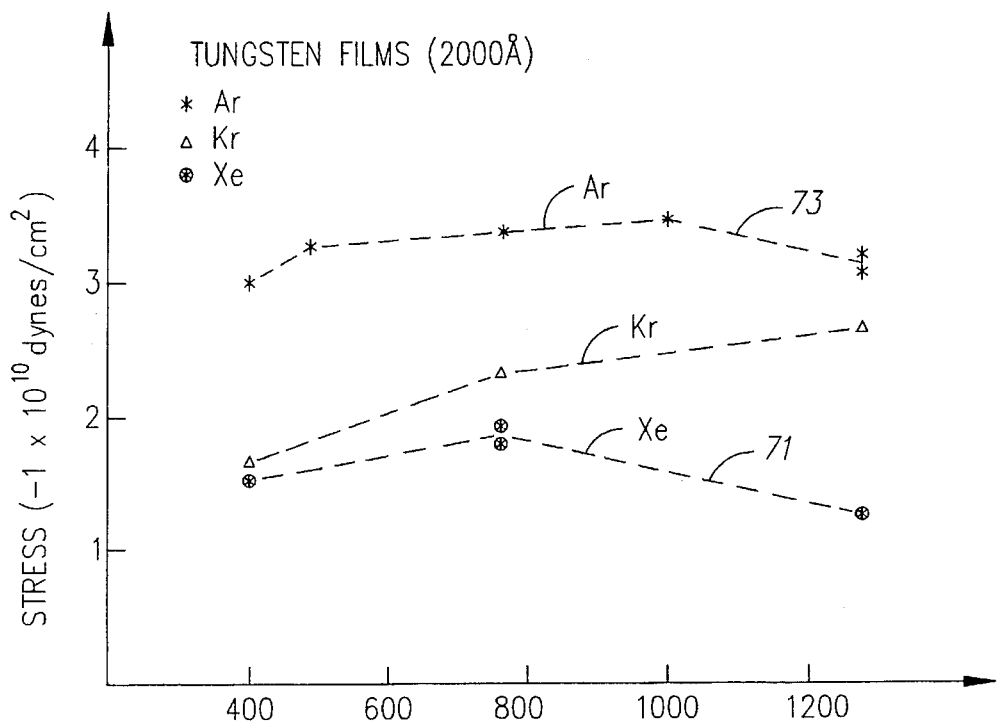
FIG. 5a is a graph plotting Argon concentration in a tungsten film versus ion beam voltage.
Figure 5B:
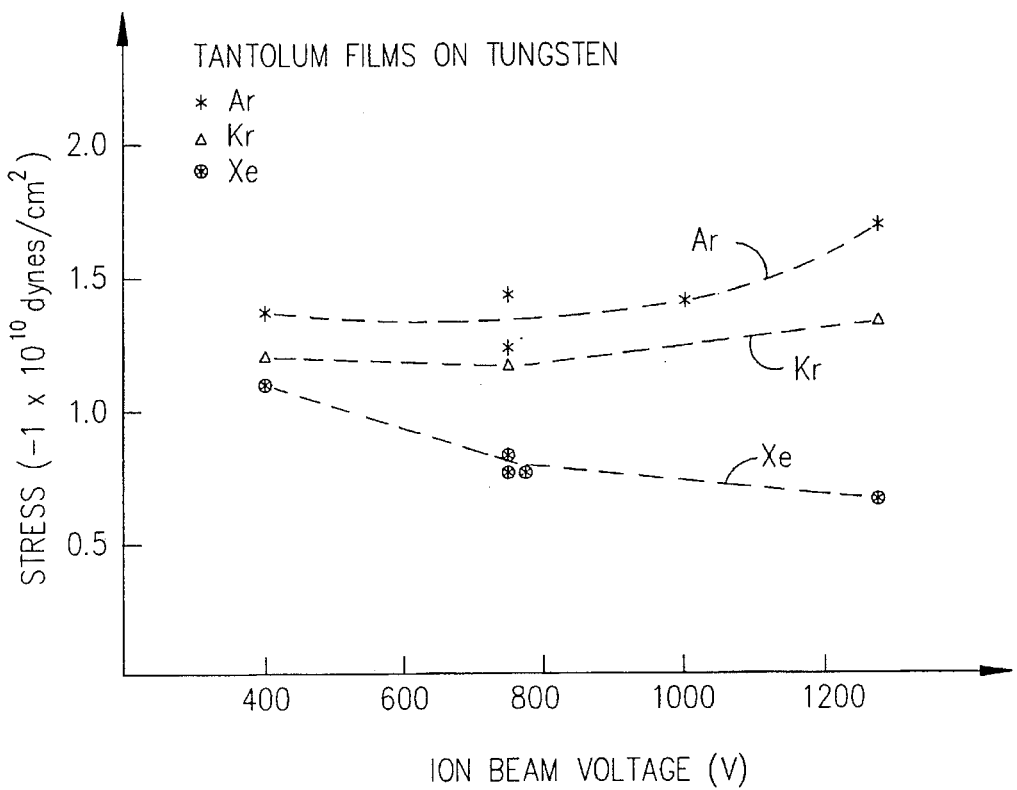
FIG. 5b is a graph plotting film density versus ion beam voltage deposited in selected ion gases for tungsten.
Figure 5C:
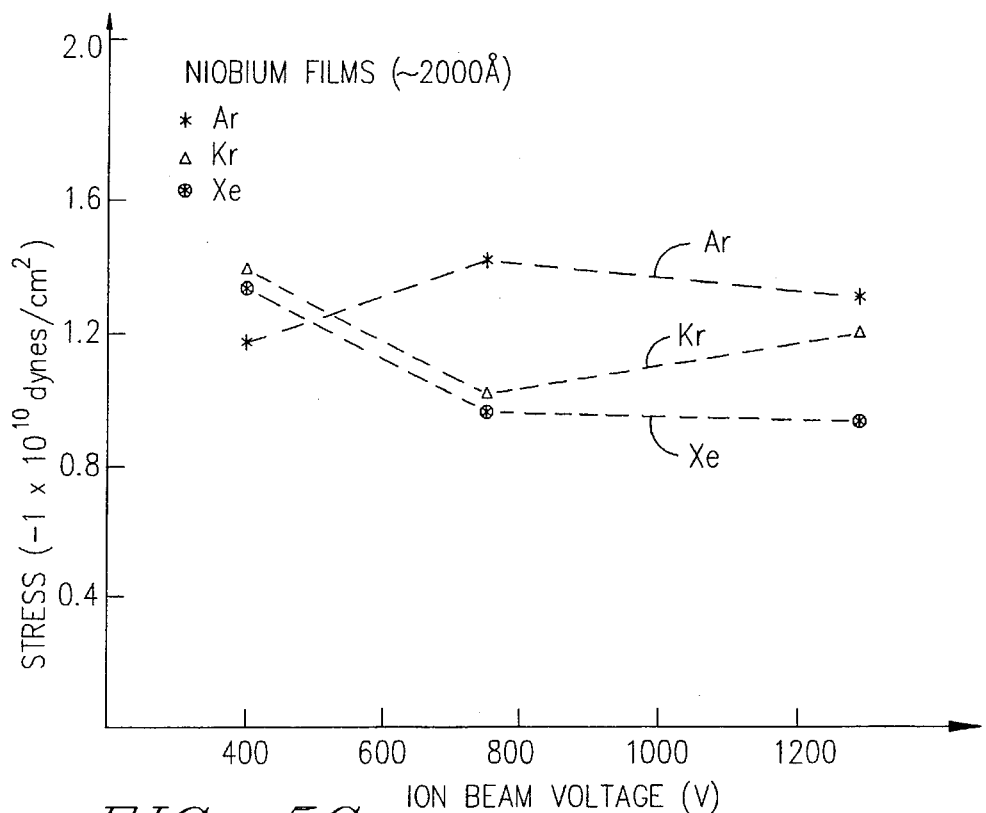
Figure 5D:
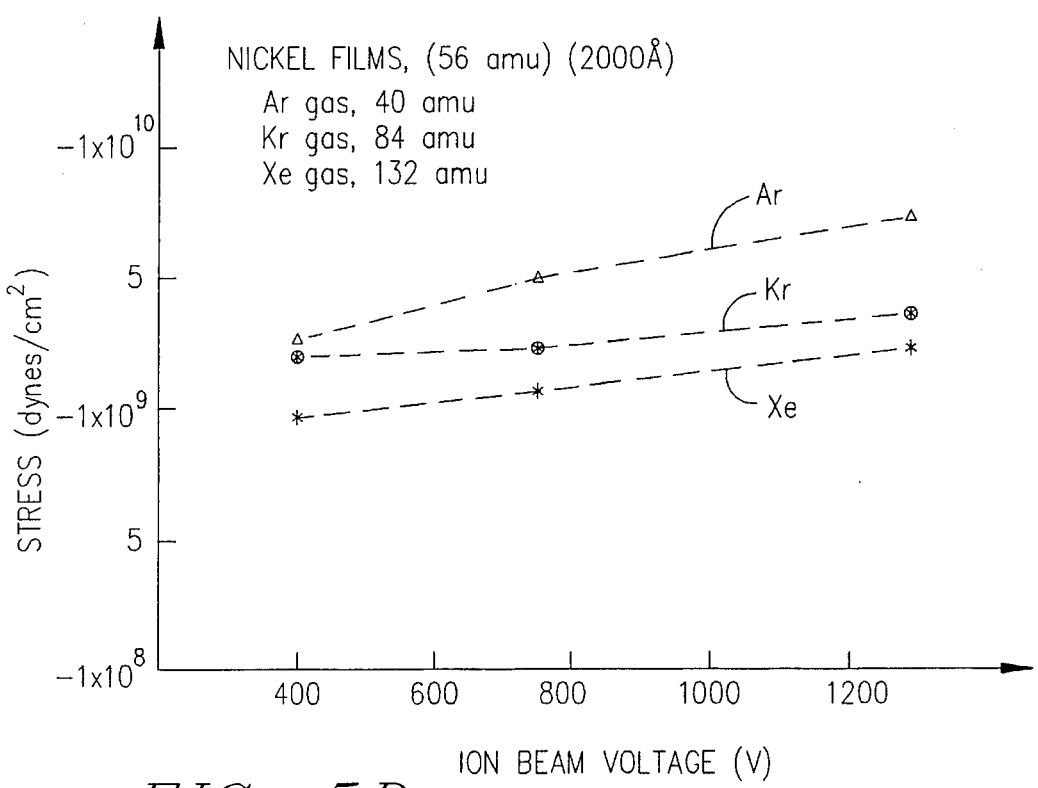

As discussed above, internal stress in ion beam sputtered films is due primarily to high energy bombardment of the growing film by backscattered neutral atoms from the target. As shown in FIGS. 5a, ion beam deposited W films using Xe as the sputtering gas produce films, curve 71, have approximately a factor of 2 less internal stress when compared to W films deposited using Ar as the sputtering gas, curve 73. As shown in FIGS. 5b–5d, similar results for internal stress are obtained for ion beam sputtered films of Ta (over W), Nb and Ni, respectively.

Figure 6A:
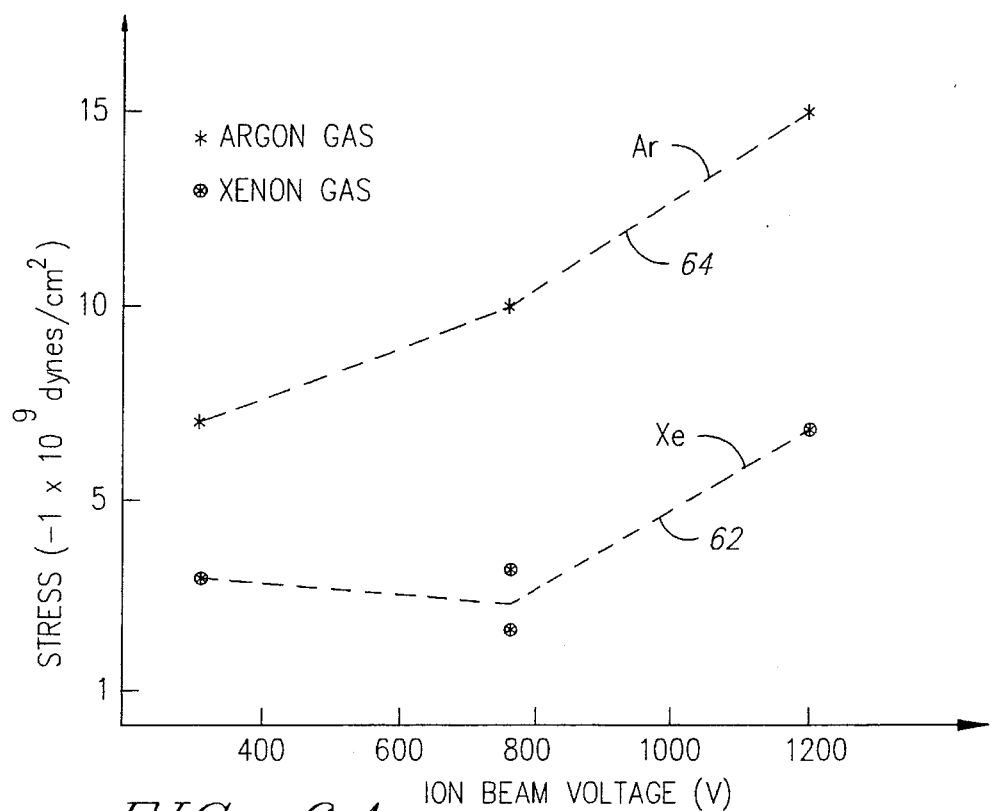
FIG. 6a is a graph plotting internal stress versus ion beam voltage for NiFe films as a function of sputter ion mass.
Figure 6B:
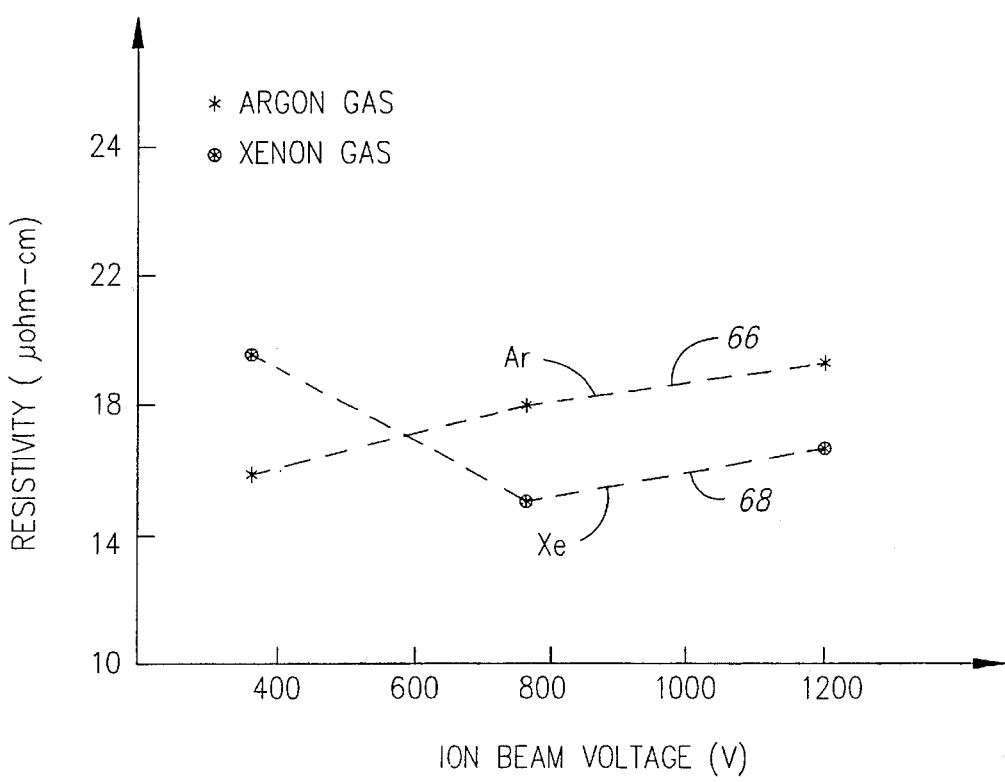
FIG. 6b is a graph plotting resistivity versus ion beam voltage for NiFe films as a function of sputter ion mass.

Referring now also to FIGS. 6a and 6b, in addition to the materials described above, the electrical and magnetic properties of selected metallic alloys thin films such as nickel-iron (NiFe), also referred to as Permalloy, alone and in multilayered thin film structures have been extensively studied. Since the atomic masses of Ni (58 amu) and Fe (56 amu) are very close, one expects that both sputtering gas mass and ion energy would affect the properties of ion beam sputtered NiFe thin films approximately the same manner in which identical properties of elementary Ni, described above, are affected, FIGS. 6a and 6b illustrate the internal stress and resistivity, respectively, as a function of ion energy and sputtering gas for approximately 2000 Å thick NiFe films. As shown in FIG. 6a, the internal stress generally increases as ion beam voltage increases. The lowest internal stress was observed using Xe as the sputtering gas, curve 62, having an atomic mass greater than that of the NiFe target material while the lighter At, curve 64, produced significantly higher internal stress in the NiFe target. Similarly, as shown in FIG. 6b, the resistivity of NiFe films increases with ion beam voltage for Ar, curve 66, and, above approximately 750 volts, for Xe, curve 68. The lowest observed resistivity was for a NiFe film deposited utilizing a 750 ev Xe ion beam.

In order to provide practical magnetoresistive (MR) read sensors for use in magnetic recording devices, it is desirable to optimize as much as possible the MR and magnetic properties of the materials, such as NiFe, for example, utilized for the MR element in the sensor structure. In the prior art, DC or magnetron sputter deposition, for example, it is critical to use a Ta underlayer with a NiFe layer to achieve sufficient MR response for MR sensor applications. In contrast, ion beam deposited NiFe films, both with and without Ta underlayers exhibit nearly identical values of MR and other magnetic properties. Eliminating the Ta underlayer dependence provides many more options and alternatives when designing an MR sensor. The characterization of the NiFe films included the measurement of electrical resistance (R), the change in R under an applied magnetic field (dR).and the ratio dR/R as well as the coercivity and anisotropy field ($H_k$) of the film. NiFe films were deposited both with a Ta underlayer and directly on glass substrates. The bilayer structures (NiFe/Ta) having 50 and 100 A NiFe films show a lower magnetoresistance compared to the NiFe films deposited directly on glass substrates because the Ta underlayer carries a significant portion of the measuring current. For NiFe layers greater than 250 Å thickness, the Ta underlayer no longer contributes to this effect. These films exhibited a relatively low $H_c$, $H_k$ and sheet resistance while having a relatively good magnetoresistance. Magnetostriction measurements showed a value of $0.25 \times 10^{-6}$ for a 267 Å thick NiFe film.

Soft magnetic films of nickel-iron-rhodium (NiFeRh) were also deposited using ion beam deposition and the electrical and magnetic properties evaluated. The NiFeRh films exhibited relatively good magnetoresistance and sheet resistance. The magnetoresistance of a 100 A thick NiFeRh film was measured to be only 0.192 Ohms/square while the sheet resistance was found to be 43.5 Ohms/square. Magnetostriction measurements showed a value of $0.13 \times 10^{-6}$ for the 100 Å thick NiFeRh film.

Table II summarizes the experimental results for ion beam deposited NiFe films with and without a Ta underlayer (on a glass substrate) and for NiFeRh films on a glass substrate. In Table II, all NiFeRh film thickness values represent magnetic thickness and are equivalent to NiFe thicknesses of the same value. For example, for NiFeRh films, magnetic thickness X 1.22 provides the actual physical thickness of the film.

TABLE II

ION BEAM SPUTTERED NiFE FILMS

| Run # | Ions gas/eV | Thick (Å) NiFe/TA | R (Ω/sq) | dR (Ω/sq) | dR/R (%) | $H_c$ (Oe) | $H_k$ (Oe) |
|---|---|---|---|---|---|---|---|
| 1239 | Xe/750 | 300/— | 7.84 | 0.178 | 2.27 | 1.55 | 3.9 |
| 1240 | Xe/750 | 285/— | 7.84 | 0.179 | 2.29 | 1.47 | — |
| 1241 | Xe/750 | 313/— | 8.17 | 0.183 | 2.24 | 1.53 | — |
| 1303 | Xe/750 | 105/— | 33.24 | 0.631 | 1.90 | 1.06 | 4.4 |
| 1302 | Xe/750 | 49/— | 69.77 | 0.854 | 1.22 | 0.91 | 4.2 |
| 1307 | Xe/750 | 21/— | 170.00 | — | — | 1.05 | 4.5 |
| 1242 | Xe/750 | 287/100 | 7.31 | 0.184 | 2.51 | 1.56 | — |
| 1243 | Xe/750 | 273/100 | 7.89 | 0.199 | 2.53 | 1.44 | — |
| 1286 | Xe/750 | 253/125 | 8.06 | 0.202 | 2.51 | 1.37 | 4.0 |
| 1249 | Xe/750 | 103/120 | 20.36 | 0.373 | 1.83 | 1.03 | 3.0 |
| 1265 | Xe/750 | 104/100 | 20.77 | 0.372 | 1.79 | 1.03 | 3.1 |
| 1268 | Xe/750 | 80/100 | 26.17 | 0.424 | 1.69 | 0.97 | 3.1 |
| 1250 | Xe/750 | 53/120 | 41.54 | 0.477 | 1.15 | 0.74 | 3.0 |
| 1309 | Xe/750 | 20/30 | 156.00 | — | — | 0.95 | 2.8 |
| 1263 | Xe/750 | cap/106/100 | 20.36 | 0.338 | 1.65 | 0.97 | 3.2 |
| 1264 | Xe/750 | cap/103/100 | 19.9 | 0.353 | 1.77 | 0.81 | 3.2 |
| 1259 | Ar/400 | 100/120 | 23.68 | 0.39 | 1.64 | 0.92 | 3.9 |
| 1335 | Ar/400 | 237/— | 11.3 | 0.24 | 2.10 | 1.08 | 3.8 |
| 1337 | Ar/400 | 212/— | 13.72 | 0.25 | 1.81 | 1.26 | 3.6 |
| 1312 | Xe/750 | 104 NiFeRh | 43.0 | 0.19 | 0.44 | 1.08 | 3.6 |
| 1332 | Xe/750 | 270 NiFeRh | 16.89 | 0.07 | 0.42 | 1.30 | 3.2 |
| 1333 | Ar/1000 | 130 NiFeRh | 38.6 | 0.14 | 0.37 | 1.15 | 3.6 |
| 1336 | Ar/400 | 120 NiFeRh | 38.6 | 0.17 | 0.43 | 1.23 | 3.5 |

Figure 7:
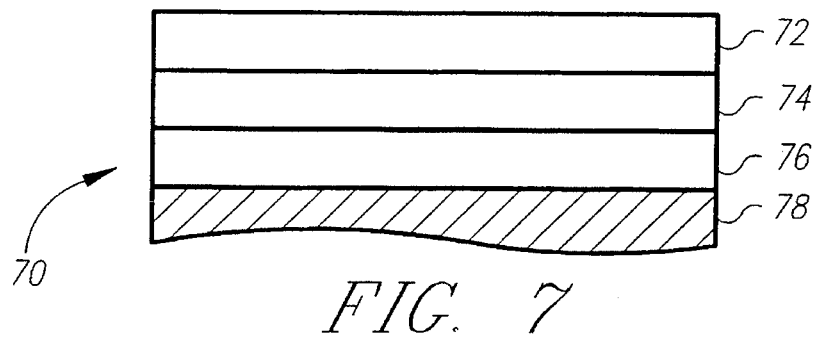
FIG. 7 is a diagram illustrating a trilayer structure deposited on a substrate according to the principles of the present invention.

Referring now also to FIG. 7, a trilayer MR structure comprising a soft magnetic layer 76, a spacer layer 74 and an MR layer 72 is formed on substrate 78 by ion beam deposition as described above. The magnetic and electrical properties of an ion beam sputtered trilayer structure 70 comprising a thin film soft magnetic layer of NiFeRh 76, a thin film spacer layer of Ta and a thin film MR layer of NiFe deposited on substrate 78 was analyzed for various combinations of layers of different thicknesses. For a specific structure, NiFeRh(150A)/Ta(125A)/NiFe(250A), the observed dR/R was between about 2.02 and 2.11 percent which compare favorably to current values of dR/R obtainable in trilayer structures fabricated using conventional DC or magnetron sputtering systems. Additionally, the ion beam sputtered NiFe films in the trilayer structure 70 exhibited superior electrical and magnetic properties. Magnetostriction measurements provided values of about $0.25 \times 10^{-6}$ for the MR trilayer. The R, dR and dR/R values observed for the trilayer 70 are shown in Table III below. For all films tabulated in Table III the anisotropic field as about 3.5 Oe.

TABLE III

ION BEAM SPUTTERED MR TRILAYER STRUCTURE

| Run # | Thick. (Å) NiFe/Ta/SM | R (Ω/sq) | dR (Ω/sq) | dR/R (%) |
|---|---|---|---|---|
| 1313 | 253/125/150 | 6.13 | 0.129 | 2.1 |
| 1315 | 245/125/150 | 6.19 | 0.127 | 2.06 |
| 1316 | 240/125/150 | 6.39 | 0.129 | 2.02 |
| 1317 | 243/125/150 | 6.25 | 0.130 | 2.08 |
| 1319 | 251/125/150 | 6.18 | 0.127 | 2.05 |
| 1339 | 253/125/155 | 6.60 | 0.144 | 2.18 |
| 1340 | 259/125/155 | 6.68 | 0.144 | 2.15 |
| 1320 | 197/115/145 | 7.30 | 0.14. | 1.92 |
| 1321 | 170/92/130 | 8.94 | 0.150 | 1.67 |
| 1323 | 110/75/92 | 13.08 | 0.212 | 1.62 |
| 1324 | 92/68/75 | 16.62 | 0.233 | 1.40 |
| 1314 | 90/70/52 | 17.9 | 0.273 | 1.53 |
| 1325 | 75/40/60 | 23.26 | 0.301 | 1.30 |
| 1326 | 45/34/40 | 37.77 | 0.364 | 0.965 |
| 1346 | 340/125/222 | 4.40 | 0.103 | 2.34 |
| 1266 | 267/100/— | 7.71 | 0.198 | 2.57 |

Figure 8A:
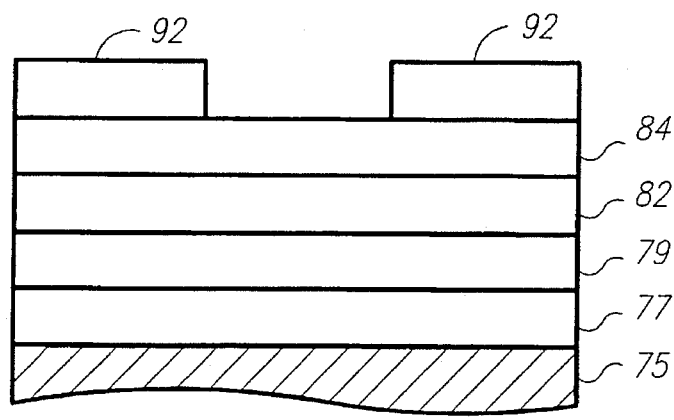
FIGS. 8a and 8b are diagrams illustrating magnetoresistive sensor structures deposited on a substrate according to the principles of the present invention.
Figure 8B:
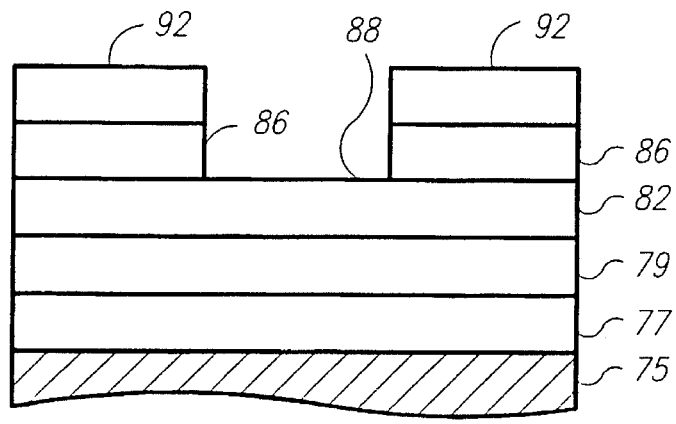

Referring now also to FIGS. 8a and 8b, FIG. 8a illustrates an MR sensor 80 of the type described in U.S. Pat. No. 5,014,147 comprising a multilayer MR structure 80 having a soft magnetic layer 77, a spacer layer 79, an MR layer 82 and a longitudinal bias layer 84 deposited on a substrate 75. Conductor leads 92 deposited over the end regions of the longitudinal bias layer 84 provide electrical connection of the MR sensor to external circuitry (not shown). FIG. 8b illustrates an MR sensor 90 of the type described in U.S. Pat. No. 4,663,685 similar to the MR sensor 80 illustrated in FIG. 8a in that multilayer structure 90 comprises a soft magnetic layer 77, a spacer layer 79 and an MR layer 82 deposited on a substrate 75. The longitudinal bias layer 86, however, is deposited over the end regions only of the MR layer 82 providing a patterned bias field which forms an MR sensor having an active central region 88 and passive end regions. The lead conductors 92 are deposited over the patterned longitudinal layer at the end regions of the MR element to provide electrical connection to external circuitry (not shown).

In a preferred embodiment, a multilayer MR sensor, such as MR sensors 80, 90, fabricated utilizing ion beam deposition techniques as described hereinbelow, comprises a soft magnetic layer 77 of NiFeRh, a spacer layer 79 of Ta and an MR layer 82 of NiFe deposited on a substrate 75. The longitudinal bias layer 84 is a hard bias layer, as is well known in the art, such as a layer of CoPtCr, CoCr or CoPt deposited in end regions of the MR layer 82 as described in U.S. Pat. No. 5,018,057 to Krounbi et al. Alternatively, the longitduinal bias layer 84, 86 may comprise a layer of antiferromagnetic material, such as manganese-iron (MnFe) or nickel-manganese (NiMn) or other suitable material, deposited over and in direct contact with the MR layer 82 and which provides an exchange-coupled bias field in the MR layer 82. The conductor leads 92 are deposited on the longitudinal bias layer 84 over the end regions of the MR layer 82 and preferably are of Ta (bcc phase), W, Nb or Ru having a resistivity near their bulk material value. For soft magnetic layer 77, NiFeRh or NiFeCr or other suitable soft magnetic material may be used. For the MR layer 82, ferromagnetic materials such as Ni, Fe, Co and alloys thereof, NiFe and NiFeCo, for example, or other suitable materials may be used. For the spacer layer 79, tantulum (hcp phase), $Al_2O_3$, $SiO_2$ and oxide compounds of tantalum, such as $Ta_2O_5$, can be used. Materials, such as Ta, having a suitable crystalline structure which promotes the desired MR layer 82 growth are preferable for the spacer layer 79.

As described above, the resistivity of the ion beam deposited films can be controlled by choosing the appropriate sputtering gas and ion beam energy. In general, high resistivity ion beam sputtered films are obtained by utilizing a low mass sputtering gas, such as Ar or Ne, with higher ion beam energies, typically greater than 1000 eV. lower film resistivities may be obtained utilizing lower energy, 400–750 eV, Ar, Kr or Xe ions, matching the sputtering gas atomic mass to the target material atomic mass.

Utilizing ion beam deposition and optimizing the resistivities for the different materials used in the MR trilayer, i.e., the soft magnetic layer 77, the spacer layer 79 and the MR layer 82, a 10 to 14 percent increase in the magnetoresistance and a 4 to 8 percent increase in the MR coefficient for the MR sensors 80, 90 has been achieved. Specifically, the resistivities of the NiFeRh soft magnetic layer 77 and the Ta spacer layer 79 are increased while the resistivity of the NiFe MR layer 82 is set at a relatively low value. In such a structure, the current carried by the MR layer 82 is maximized resulting in an increase in the dR and dR/R for the trilayer 77,79,82. The resistivity of the longitudinal bias layer 84 is also controlled during deposition to provide a relatively high resistivity to minimize current shunting by the bias layer 84. Alternatively, for the embodiment described with reference to FIG. 8b, wherein the longitudinal bias layer 86 is deposited over the MR layer 82 end regions only, the ion beam gas and energy are selected to provide a relatively low resistivity longitudinal bias layer 86 in order to provide a low resistance path between the MR layer 82 and the lead conductors 92. Similarly, the resistivity of the lead conductors 92 is controlled to provide a low resistance to current flow. As described above, using ion beam deposition, near bulk resistivities are obtainable for thin films of suitable materials for lead conductors 92.

In a specific example, a thin film layer of NiFeRh 77 followed by a thin film layer of Ta 79 was deposited utilizing Ar gas at 1000 eV, or higher energies, to provide films having relatively high resistivities. Then, a thin film of NiFe 82 was deposited using Xe gas having a beam energy of 750 ev to provide a relatively low resistivity MR layer. Alternately, Kr gas at a beam energy of 750 ev or Ar gas at a beam energy of 400 ev can be used to deposit the MR layer 82. Similarly, using a relatively low mass, high energy ion beam, the longitudinal bias layer 84 having a relatively high resistivity is deposited over the MR layer 82. Finally, using a relatively high mass, low energy ion beam, the lead conductors 92 are deposited on the longitudinal bias layer 84 over the end regions of the MR layer 82.

Using 1000 ev Ar ion beams rather than 750 ev Xe ion beams increased the sheet resistance by about 12 and 35 percent for the NiFeRh and Ta films, respectively. The optimized sheet resistance values obtained were 38 Ohms/square for 130 Å thick NiFeRh films and 234 Ohms/square for 120 Å thick Ta films. The R, dR and dR/R for MR trilayers having optimized layers 77,79,82 as described above are shown in Table III above. Samples 1339 and 1360 comprise high resistivity NiFeRh and Ta layers deposited using 1000 ev Ar ions and a low resistivity NiFe layer deposited using 750 ev Xe ions. For comparison, all layers for samples 1313 and 1319 were deposited using 750 ev Xe ion beams.

Figure 9:
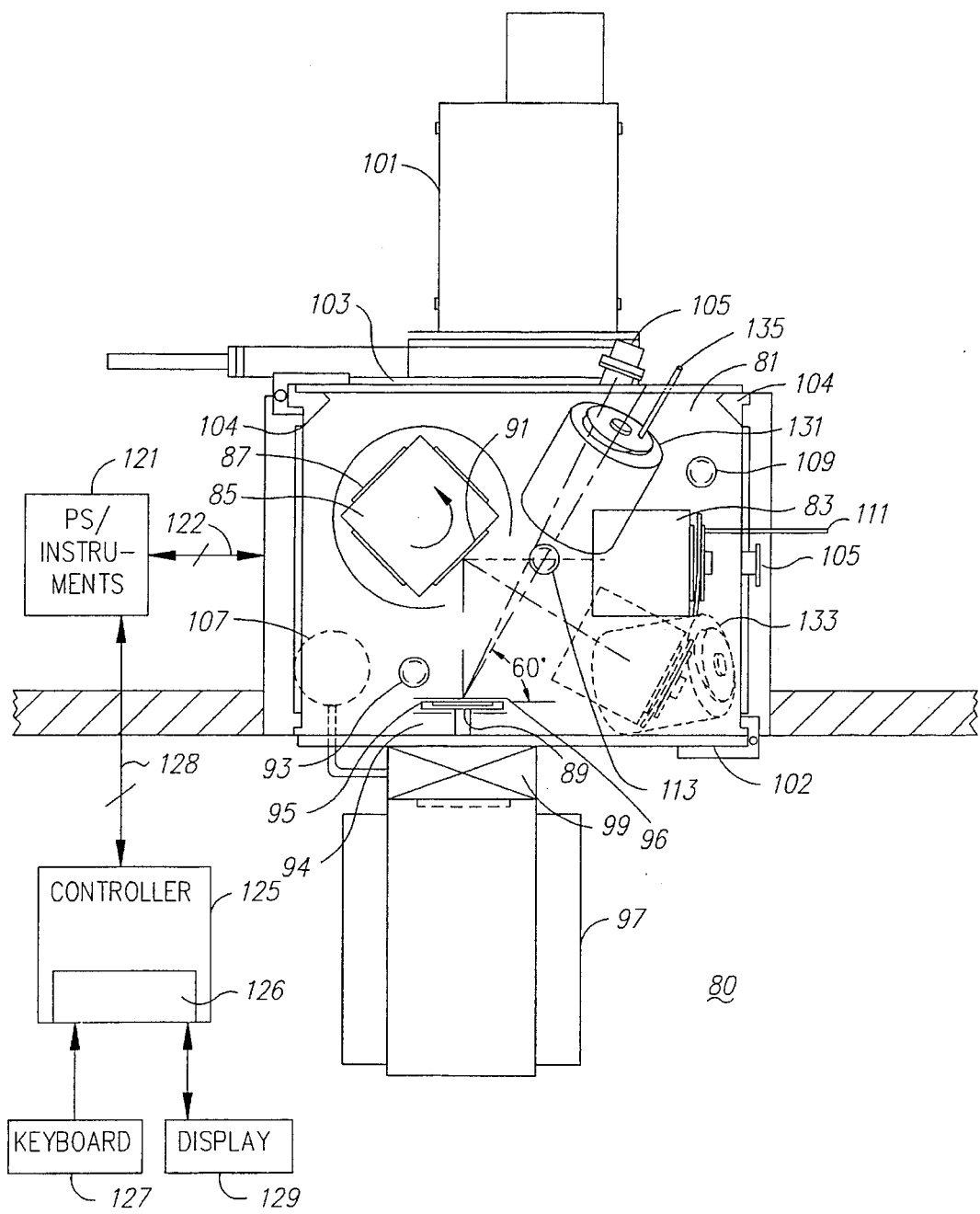
FIG. 9 is a block diagram illustrating a preferred embodiment of an ion beam deposition system according to the principles of the present invention.

Referring now also to FIG. 9, a detailed diagram illustrating a preferred embodiment of an ion beam sputtering system 80 according to the principles of the present invention is shown. The ion beam sputter deposition system 80 includes a vacuum chamber 81 in which a primary ion beam source 83 is mounted, a multi-target, rotatable support 85 having one or more targets 87 of selected materials mounted thereon and a deposition substrate 89. An ion beam provided by the ion source 83 is directed at a selected target 91 where the impacting ions cause sputtering of the target material. The sputtered ions emitted by the target material are directed onto a deposition substrate or other workpiece 89 on which is formed a layer of the selected target 91 material. A thickness monitor 93 is positioned closely adjacent the substrate 89 to provide real-time, in-situ monitoring of the thickness of the growing film during deposition (a quartz crystal thickness monitor model XTC manufactured by INFICON is suitable for this purpose).

The substrate or other workpiece 89 is mounted on a movable pedestal or support member 95 which is retrieved into a cart mounted load-lockstage (loading port) 97 via a gate valve 99 for changing the workpiece 89. A turbo pump 107 is provided to pump down the load-lockstage 97. The pedestal 95 is temperature controlled, i.e., heated and cooled as required for the particular deposition process. The pedestal 95 is rotatable by means of a linear/rotary motor drive (not shown) to allow selective deposition and other operations on a number of substrates 89 without reload between operations. The pedestal 95 includes a shutter 96 to prevent bombardment of the substrate 89 by sputtered materials during pre- and post-deposition operations such as, for example, precleaning of the target 91 with the primary ion source 83. Moveable shields 94 are provided to prevent material buildup on portions of the pedestal 95 and the gate valve 99 components.

During operation, the vacuum chamber 81 is maintained at an internal operation pressure on the order of $1 \times 10^{-4}$ Torr by a cart mounted vacuum pump system 101 via a port provided in the chamber adjacent rear door 103. Hinged front and rear doors 102 and 103, respectively, provide access to the chamber and components mounted therein for cleaning, replacement of targets and adjustment or repair. In addition, a number of observation ports 105 and accessory ports 109 are provided in the chamber walls. Internal electric heaters 104 mounted within the chamber provide a controlled environment within the chamber. Power and instrumentation for the system and its components are provided by a power supply/instrumentation module 121 coupled to the system via cables 122. The operation of the system is controlled by a programmable controller 125 coupled to the system via cables 128.

The primary ion source comprises a 12 cm Kaufman ion source adjustably mounted to provide a variable angle of incidence of the ion beam on the target 91 over a range of 0 degrees, i.e., normal to the target, to about 60 degrees. A number of gases including Ar, Kr and Xe gases are stored in pressurized bottles (not shown) and are selectably ported to the ion source 83 via inlet port 111 to provide a selectable sputtering gas as desired for matching to the selected target material. A probe 113 (a Faraday Cup is suitable for this purpose) is provided for analysis of the ion beam energy. A residual gas analyzer mounted on inside wall of rear door 103 monitors and records partial pressures of the sputtering and background gases continuously, i.e., before, during and after the deposition process. The Kaufman source 81 provides an ion beam in the energy range of approximately 200 to 2000 ev. The ion source voltages, ion beam energy and current, selection of sputtering gas and other ion source parameters are automatically controlled by the programmable controller 125.

A secondary ion source 131, which may comprise a 3, 8 or 12 cm Kaufman source, is mounted within the vacuum chamber 81 to provide substrate preclean etch and substrate ion-assisted deposition functions. The secondary source 131 is mounted to provide an ion beam of desired energy at an angle of incidence nominally at approximately 60 degrees. The angle of incidence is adjustable over a large range (25–75 degrees) to provide an optimum angle of incidence as required. Alternatively, a second secondary ion source 133 may be mounted as shown to provide a glazing angle of incidence, approximately 10 degrees, dedicated to a substrate precleaning function only. The secondary ion source 131 is ported to a selected gas supply (not shown) via inlet port 135 to provide a desired ionizable gas for the ion source operation. The secondary ion source 131 is controlled by programmable controller 125 in a manner similar to that of the primary ion source 83.

Referring now also to FIGS. 10a–10f and with continuing reference to FIG. 9, the programmable controller 125 is coupled to the power supply/instrumentation module 121 to provide control of the ion beam sputter deposition system 80. The controller 125 provides all operation control signals and parameters to the system and receives feedback from the system, such as readings from the thickness monitor 93 and ion beam probe 113, to monitor the progress of the deposition process. The controller 125 includes a computer 126 which in a preferred embodiment comprises an IBM PCAT computer. The computer 126 is coupled to operator input means such as keyboard 127 and display means 129 for entry of system operating parameters and instructions such as sputter times for selected target materials and desired thickness of the various deposited films. The entire deposition process is programmed and proceeds essentially automatically under the computer's direction and control commencing with a fresh workstage (pedestal) 95 loaded and locked in the load-lockstage for loading into the deposition chamber 81. The operation is completed when the workstage 95 is withdrawn from the deposition chamber 81 after completion of the deposition process. A flow chart outlining a typical deposition process is listed in Table IV below.

The programming for a particular desired deposition process is accomplished by specifying a master recipe which is made of a number of beam and film recipes. The programming process is menu-driven, entry being effected via a main menu, as shown in FIG. 10a. The master, film and beam recipes are all stored on the controller 125 hard disk or other memory means (not shown) for retrieval and use during automatic operation of the system. All three types of recipes are created and maintained using a PROGRAM mode editor feature of the system control program. Appropriate screens are provided on the computer display 129 for defining the various recipes and other programming functions.

The master recipe defines the process for a multilayer film structure specifying parameters unique to the particular structure define as well as required film and beam recipes. Each film recipe specifies the parameters, for example, material and thickness of a single layer of a multilayer structure. Beam recipes are called out by both master and film recipes to specify what ion source, beam characteristics and sputter gas set points are to be used for required ion beam functions such as substrate preclean etch, target preclean etch, sputter deposition from a target or substrate ion-assisted etch or deposition during the deposition operation. Each of the three types of recipes, beam, film and master, have the same style of editor and are handled by similar sub-menus.

FIG. 10b illustrates the film recipe format. The name of the recipe appears first, then the name of the deposition ion beam recipe, called out by its disk file name. The use of an ion-assisted etch on the substrate during deposition is optional, if required, a beam recipe name must be specified. The prompt for "Target Material" is filled in with the user-assigned name for the desired material to be deposited. The next four parameters provide the desired film thickness, deposition rate and tolerances on the deposition rate. Ambient gas flow and wobble are optional, as required. A value less than 0.25 for ambient gas flow is read as zero.

FIGS. 10c and 10d illustrate the two screens required for the beam recipe. The first screen, FIG. 10c, provides operator-settable setpoints for beam voltage, beam current and gas flow. The second screen, FIG. 10d, provides upper limits for non-operator-settable system parameters. The beam recipes provide the information required for the system control software to perform ion beam boundary checking during system operation.

FIGS. 10e and 10f illustrate the two screens required for the master recipe. The first screen, FIG. 10e, provides the master recipe name, the substrate (stage) pre-clean etch beam recipe name, the substrate pre-clean etch duration, the target pre-clean etch beam recipe name and the target pre-clean etch duration. Basically, the first screen specifying cleaning of the substrate (stage) and the target cleaning beam and duration. The second screen, FIG. 10f, defines which of the targets called out by the master recipe are required to be cleaned. The second screen defines the sequence of film recipes to be used to deposit the defined multilayer film.

TABLE IV

PROCESS FLOW FOR
ION BEAM DEPOSITION SYSTEM

BEGIN
LOADLOCK INSERTION CYCLE turn on loadlock turbo pump;
    open loadlock rough valve;
    move stage shutter to "load" position;
    wait for loadlock to rough down, then do over-rough;
    close loadlock rough valve;
    open loadlock gate valve;
    insert stage;
DEPOSITION CYCLE start_of_deposition:
    start Inficon XTC RS-232 comm link;
    check hardware status;
    turn on cooling water as required;
    turn on stage spin;
    if stage preclean has been selected via recipe, then:
    close target shutter;
    move stage shutter to "process" position;
    select stage preclean recipe;
    start etch source with desired recipe;
    start beam with desired recipe;
    start stage preclean timer;
    monitor stage preclean and wait until done;
    stop etch beam;
start_of_film:
    if the recipe calls for a film to be deposited, then:
        open target shutter;
        select target to be used for this film;
        if target preclean has been selected via recipe,
then:
            select computer control of deposition beam current;
            move stage shutter to "load" position (cover stage) ;
            select target preclean recipe;
            start deposition source with the desired recipe;
            start deposition beam with the desired recipe;
            start target preclean timer;

TABLE IV-continued

PROCESS FLOW FOR ION BEAM DEPOSITION SYSTEM

```
        monitor target preclean and wait until done;
        stop deposition beam;
        stop deposition source;
    start stage spin;
    if ion assist has been selected via recipe, then:
        select ion assist recipe;
        start etch ion source;
        start etch ion beam;
    if chamber gas flow has been selected via recipe,
then:
        set ambient gas flow desired;
    select computer control of deposition beam
current;
    select film deposition recipe;
    start deposition source;
    move stage shutter to "load" position (cover
stage);
    start deposition beam;
    download film parameters from computer to XTC;
    start XTC;
    select Inficon XTC control of deposition beam
current;
    wait for deposition rate to stabilize within
    desired tolerances;
    move stage shutter to "process" position;
    monitor deposition and wait until film reaches
    desired thickness;
    move stage shutter to "load" position;
    stop deposition beam;
    if ion assist was not selected via recipe for next
    film:
        stop etch source;
    if chamber gas was not selected via recipe for
    next film:
        stop chamber gas flow;
    if film is last film, go to "normal_end", if next
    film selected, go to "start_of_film";
normal_end:
    stop etch beam;
    stop deposition beam;
    stop etch source;
    stop deposition source;
    stop chamber gas flow;
    stop Inficon XTC;
    turn off chamber cooling water;
    turn off stage cooling water;
    turn off Inficon XTC cooling water;
    close target shutter;
LOADLOCK WITHDRAW CYCLE stop stage spin;
    move stage shutter to "load" position
    withdraw stage;
    close loadlock gate valve;
    open both loadlock rough and vent valves;
    turn off loadlock turbo pump;
    wait one (1) minute;
    close both loadlock rough and vent valves:
END
```

While the present invention has been particularly shown and described with reference to preferred embodiments thereof, it will be understood by those skilled in the art that various changes in form and detail may be made therein without departing from the spirit, scope and teaching of the invention. Accordingly, the invention herein disclosed is to be considered merely as illustrative and limited in scope only as specified in the appended claims.

I claim:

1. A method for fabrication of a multilayered magnetoresistive sensor structure utilizing an ion beam sputter deposition process, comprising the steps of:

forming a soft magnetic layer on a substrate by sputtering a soft magnetic layer target material of a specified atomic mass using a first ion beam sputtering gas of a specified atomic mass, said first ion beam sputtering gas atomic mass and the soft magnetic layer target material atomic mass being in a first ratio of a predetermined value;

forming a spacer layer over said soft magnetic layer by sputtering a spacer layer target material of a specified atomic mass using a second ion beam sputtering gas of a specified atomic mass, said second ion beam sputtering gas atomic mass and the spacer layer target material atomic mass being in a second ratio of a predetermined value; and forming a magnetoresistive layer over said spacer layer by sputtering a magnetoresistive layer target material of a specified atomic mass using a third ion beam sputtering gas of a specified atomic mass, said third ion beam sputtering gas atomic mass and the magnetoresistive layer target material atomic mass being in a third ratio of a predetermined value.

2. The method of claim 1 wherein the ratio of the atomic mass of said ion beam sputtering gas to the atomic mass of said target material comprises a ratio having a range of about 0.217 to about 2.357.

3. The method of claim 2 wherein said third predetermined value is greater than one.

4. The method of claim 1 including the additional step of controlling the energy of the ion beam sputtering gas as a function of a selected sputtering gas and a selected target material.

5. The method of claim 1 including the additional steps of:

providing a plurality of sputtering targets of different target materials; and sequentially selecting sputtering targets of selected target materials in response to operator input to an automatic control means for depositing multiple layers of predetermined materials on said substrate.

6. The method of claim 5 including the additional step of automatically selecting a predetermined sputtering gas associated with each said selected target material responsive to operator input to said automatic control system.

7. The method of claim 1 wherein said spacer layer is of a material selected from the group consisting of tantalum, $Al_2O_3$, $SiO_2$ and oxide compounds of tantalum.

8. The method of claim 7 wherein said soft magnetic layer comprises a layer of nickel-iron-rhodium, said spacer layer comprises a layer of tantalum and said magnetoresistive layer comprises a layer of nickel-iron.

9. The method of claim 1 wherein said soft magnetic layer is of a material selected from the group consisting of nickel-iron-rhodium and nickel-iron-chromium.

10. The method of claim 1 wherein said magnetoresistive layer is of a material selected from the group consisting of nickel, iron, cobalt, nickel-iron, and nickel-iron-cobalt.

11. The method of claim 1 including the additional steps of:

forming a longitudinal bias layer over said magnetoresistive layer by sputtering a longitudinal bias layer target material of a specified atomic mass using a fourth ion beam sputtering gas of a specified atomic mass, said fourth ion beam sputtering gas atomic mass and the longitudinal bias layer target material atomic mass being in a fourth ratio of a predetermined value, said longitudinal bias layer for providing a longitudinal bias field in said magnetic layer; and forming electrical conductor leads over said longitudinal bias layer by sputtering a conductor lead target material of a specified atomic mass using a fifth ion beam sputtering gas of a specified atomic mass, said fifth ion beam sputtering gas atomic mass and the electrical conductor lead target material atomic mass being in a fifth ratio of a predetermined value, said magnetoresistive layer comprising a central active region separating end regions, said electrical conductor leads deposited over said end regions only for providing electrical connection of said magnetoresistive sensor to external circuits.

12. The method of claim 11 wherein said longitudinal bias layer comprises a layer of antiferromagnetic material deposited directly over and in physical contact with said magnetoresistive layer.

13. The method of claim 12 wherein said antiferromagnetic material is selected from the group consisting of iron-manganese and nickel-manganese.

14. The method of claim 11 wherein said electrical conductor leads are deposited in physical contact with said longitudinal bias layer over said magnetoresistive layer end regions.

15. The method of claim 14 wherein said electrical conductor leads comprise a material selected from the group consisting of tungsten, tantalum, niobium and ruthenium.

16. The method of claim 11 wherein said longitudinal bias layer is deposited over said magnetoresistive layer end regions only in physical contact with said magnetoresistive layer, said electrical conductor leads being deposited directly over said longitudinal bias layer overlaying said magnetoresistive layer end regions only.

17. The method of claim 1 wherein said ion beam sputtering gas is selectable from the group consisting of argon, krypton and xenon as a function of the target material to be sputtered.

18. A method for fabrication of a multilayered magnetoresistive sensor utilizing an ion beam sputter deposition process, comprising the steps of:

forming a soft magnetic layer on a substrate utilizing a first ion beam sputtering gas at a first predetermined sputtering energy, said first ion beam sputtering gas and said first predetermined sputtering energy selected as a function of at least one desired characteristic of said soft magnetic layer;

forming a spacer layer over said soft magnetic layer utilizing a second ion beam sputtering gas at a second predetermined sputtering energy, said second ion beam sputtering gas and said second sputtering energy selected as a function of at least one desired characteristic of said spacer layer; and forming a magnetoresistive layer over said spacer layer utilizing a third ion beam sputtering gas at a third predetermined sputtering energy, said third ion beam sputtering gas and said third sputtering energy selected as a function of at least one desired characteristic of said magnetoresistive layer.

19. The method of claim 18 wherein said soft magnetic layer comprises a layer of nickel-iron-rhodium and said spacer layer comprises a layer of tantalum.

20. The method of claim 19 wherein said first and second ion beam sputtering gas comprises argon having a sputtering energy of at least one thousand electron volts.

21. The method of claim 19 wherein said magnetoresistive layer comprises a layer of nickel-iron deposited utilizing said third ion beam sputtering gas.

22. The method of claim 21 wherein said third ion beam sputtering gas is selected from the group consisting of krypton and xenon.

23. The method of claim 22 wherein said third ion beam sputtering gas comprises xenon having a sputtering energy of approximately seven hundred fifty electrons volts.

24. The method of claim 21 including the additional steps of:

forming a longitudinal bias layer over said magnetoresistive layer utilizing a fourth ion beam sputtering gas at a fourth predetermined sputtering energy, said fourth ion beam sputtering gas and said fourth sputtering energy selected as a function of at least one desired characteristic of said longitudinal bias layer, said longitudinal bias layer for providing a longitudinal bias field in said magnetic layer; and forming electrical conductor leads over said longitudinal bias layer utilizing a fifth ion beam sputtering gas at a fifth predetermined sputtering energy, said fifth ion beam sputtering gas and said fifth predetermined sputtering energy selected as a function of at least one desired characteristic of said electrical conductor leads, said magnetoresistive layer comprising a central active region separating end regions, said electrical conductor leads deposited over said end regions only for providing electrical connection of said magnetoresistive sensor to external circuits.

25. The method of claim 24 wherein said longitudinal bias layer comprises a layer of antiferromagnetic material selected from the group consisting of iron-manganese and nickel-manganese.

26. The method of claim 25 wherein said fourth ion beam sputtering gas comprises argon gas.

27. The method of claim 25 wherein said electrical conductor leads comprises a layer of material selected from the group consisting tungsten, tantalum, niobium and ruthenium deposited over said magnetoresistive layer end regions only.

28. The method of claim 27 wherein said fifth ion beam sputtering gas comprises xenon gas having a sputtering energy of approximately seven hundred fifty electron volts.

29. The method of claim 24 wherein said longitudinal bias layer comprises a layer of antiferromagnetic material deposited over said magnetoresistive layer end regions only.

30. The method of claim 29 wherein said longitudinal bias layer comprises a layer of antiferromagnetic material selected from the group consisting of iron-manganese and nickel-manganese.

31. The method of claim 30 wherein said fourth ion beam sputtering gas comprises a gas selected from the group consisting of krypton and xenon having a sputtering energy of approximately seven hundred fifty electron volts.

32. The method of claim 19 wherein said magnetoresistive layer comprises a layer of nickel-iron deposited utilizing an ion beam sputtering gas comprising argon gas having a sputtering energy of approximately four hundred electron volts.

33. The method of claim 18 including the additional steps of forming a longitudinal bias layer over said magnetoresistive layer utilizing a fourth ion beam sputtering gas at a fourth predetermined sputtering energy, said fourth ion beam sputtering gas and said fourth sputtering energy selected as a function of at least one desired characteristic of said longitudinal bias layer, said longitudinal bias layer for providing a longitudinal bias field in said magnetoresistive layer; and forming electrical conductor leads over said longitudinal bias layer utilizing a fifth ion beam sputtering gas at a fifth predetermined sputtering energy, said fifth ion beam sputtering gas and said fifth predetermined sputtering energy selected as a function of at least one desired characteristic of said electrical conductor leads, said magnetoresistive layer comprising a central active region separating end regions, said electrical conductor leads deposited over said end regions only for providing electrical connection of said magnetoresistive sensor to external circuits.

34. The method of claim 18 wherein said soft magnetic layer is of a material selected from the group consisting of nickel-iron-rhodium and nickel-iron-chromium.

35. The method of claim 18 wherein said spacer layer is of a material selected from the group consisting of tantalum, $Al_2O_3$, $SiO_2$ and oxide compounds of tantalum.

36. The method of claim 18 wherein said magnetoresistive layer comprises a ferromagnetic material selected from the group consisting of nickel, iron, cobalt, nickel-iron, and nickel-iron-cobalt.

* * * * *

UNITED STATES PATENT AND TRADEMARK OFFICE
CERTIFICATE OF CORRECTION

PATENT NO. : 5,492,605
DATED : February 20, 1996
INVENTOR(S) : Pinarbasi et al.

It is certified that error appears in the above-indentified patent and that said Letters Patent is hereby corrected as shown below:

Column 3, line 41, delete "5a", insert --3a--.

Column 3, line 43, delete "5b", insert --3b--.

Signed and Sealed this

Second Day of July, 1996

Attest:

BRUCE LEHMAN

Attesting Officer

Commissioner of Patents and Trademarks